United States Patent
Gates et al.

(10) Patent No.: US 10,651,252 B2
(45) Date of Patent: May 12, 2020

(54) VERTICALLY INTEGRATED ACTIVE MATRIX BACKPLANE

(71) Applicant: INTERNATIONAL BUSINESS MACHINES CORPORATION, Armonk, NY (US)

(72) Inventors: Stephen M. Gates, Ossining, NY (US); Bahman Hekmatshoartabari, White Plains, NY (US); Ghavam G. Shahidi, Pound Ridge, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/226,285

(22) Filed: Mar. 26, 2014

(65) Prior Publication Data
US 2015/0279913 A1    Oct. 1, 2015

(51) Int. Cl.
*H01L 27/32* (2006.01)
*H01L 29/66* (2006.01)
*H01L 27/12* (2006.01)
*H01L 29/423* (2006.01)
*H01L 29/73* (2006.01)
(Continued)

(52) U.S. Cl.
CPC ...... *H01L 27/3248* (2013.01); *H01L 27/1251* (2013.01); *H01L 29/42304* (2013.01); *H01L 29/66265* (2013.01); *H01L 29/7317* (2013.01); *H01L 29/66242* (2013.01); *H01L 29/735* (2013.01); *H01L 29/737* (2013.01)

(58) Field of Classification Search
CPC ............... H01L 27/3248; H01L 27/326; H01L 27/3262
See application file for complete search history.

(56) References Cited

U.S. PATENT DOCUMENTS 5,705,424 A * 1/1998 Zavracky ............... A61B 3/113
257/E27.111
6,858,989 B2    2/2005 Howard
(Continued)

FOREIGN PATENT DOCUMENTS

| JP | 11024106 A | 1/1999 |
|---|---|---|
| JP | 11184406 A | 7/1999 |
| JP | 2011077441 A | 4/2011 |

OTHER PUBLICATIONS

W. Marshall Leach, Jr., "The JFET", 2008.*
(Continued)

*Primary Examiner* — Cuong Q Nguyen
*Assistant Examiner* — Peter M Albrecht
(74) *Attorney, Agent, or Firm* — Tutunjian & Bitetto, P.C.; Erik Johnson

(57) ABSTRACT

A method of forming an active matrix pixel that includes forming a driver device including contact regions deposited using a low temperature deposition process on a first portion of an insulating substrate. An electrode of an organic light emitting diode is formed on a second portion of the insulating substrate. The electrode is in electrical communication to receive an output from the driver device. At least one passivation layer is formed over the driver device. A switching device comprising at least one amorphous semiconductor layer is formed on the at least one passivation layer over the driver device.

20 Claims, 9 Drawing Sheets

(51) Int. Cl.
*H01L 29/737* (2006.01)
*H01L 29/735* (2006.01)

(56) References Cited

U.S. PATENT DOCUMENTS

| | | | |
|---|---|---|---|
| 7,786,482 B2 | 8/2010 | Yamazaki et al. | |
| 8,305,509 B2 | 11/2012 | Yamazaki et al. | |
| 8,421,940 B2 | 4/2013 | Noda et al. | |
| 8,486,797 B1 | 7/2013 | Hekmatshoartabari et al. | |
| 8,502,347 B1 | 8/2013 | Hekmatshoartabari et al. | |
| 8,581,625 B2 * | 11/2013 | Yoneda | H03K 19/17736 326/38 |
| 8,659,224 B1 * | 2/2014 | Moon | H05B 33/04 313/504 |
| 9,698,176 B1 * | 7/2017 | Kumar | H01L 27/127 |
| 2006/0118869 A1 * | 6/2006 | Lan | H01L 29/42384 257/347 |
| 2006/0119592 A1 * | 6/2006 | Wang | G09G 3/3216 345/204 |
| 2008/0121872 A1 * | 5/2008 | Choi | H01L 27/1229 257/40 |
| 2008/0180363 A1 * | 7/2008 | Jeong | H01L 27/3244 345/76 |
| 2009/0181482 A1 * | 7/2009 | Suh | H01L 27/3246 438/29 |
| 2011/0186845 A1 | 8/2011 | Yamayoshi et al. | |
| 2012/0210932 A1 | 8/2012 | Hekmatshoar-Tabari et al. | |
| 2013/0307075 A1 | 11/2013 | Hekmatshoar-Tabari et al. | |
| 2013/0313551 A1 | 11/2013 | Hekmatshoar-Tabari et al. | |
| 2013/0313552 A1 | 11/2013 | Hekmatshoar-Tabari et al. | |
| 2013/0328110 A1 | 12/2013 | Hekmatshoar-Tabari et al. | |
| 2015/0243722 A1 * | 8/2015 | Kwon | H01L 27/3262 257/40 |

OTHER PUBLICATIONS

Hekmatshoar, B., et al. "Reliability of Active-Matrix Organic Light-Emitting-Diode Arrays With Amorphous Silicon Thin-Film Transistor Backplanes on Clear Plastic". IEEE Electron Device Letters. vol. 29, No. 1, Jan. 2008. p. 63-66.
U.S. Appl. No. 13/736,534, filed Jan. 8, 2013.
U.S. Appl. No. 13/967,128, filed Aug. 14, 2013.

* cited by examiner

VERTICALLY INTEGRATED ACTIVE MATRIX BACKPLANE

BACKGROUND

Technical Field

The present disclosure relates generally to organic light-emitting diode (OLED) displays, and more particularly to structures and methods for forming OLED displays including thin film transistors (TFTs).

Description of the Related Art

Active-matrix organic light emitting diode (AMOLED) displays are attracting attention due to several key advantages such as high efficiency, wide viewing angle, high contrast, and low fabrication cost. Among different technologies for implementation of AMOLED pixel circuits, hydrogenated amorphous silicon (a-Si:H) thin film transistor (TFT) is gathering more attention due to well established manufacturing infrastructure and low fabrication cost. However, a higher mobility of charge carriers than that in amorphous silicon (a-Si:H) thin film transistor (TFT) is desired for the driver TFT of high-resolution and power-efficient AMOLED display.

SUMMARY

In one aspect, an active matrix pixel is provided that includes a switch thin film transistor (TFT) device comprising amorphous silicon. The switch TFT device includes a TFT gate contact, a TFT drain contact and a TFT source contact. The active matrix pixel further includes a driver transistor comprised of a crystalline channel. The driver transistor includes a first contact, a second contact and a third contact. The active matrix pixel further includes an organic light-emitting diode that comprises at least one electrode. The switch TFT gate contact is connected to a row select line, and one of the switch TFT drain contact and the switch TFT source contact is connected to a data line, wherein the other of the said switch TFT drain contact and said switch TFT source contact is connected to the first contact of the driver transistor. One of the second contact and third contact of the driver transistor is connected to at least one terminal of a power supply line and the other of the second contact and third contact of the driver transistor is connected to one of the at least one electrodes of the OLED.

In another aspect, a method of forming an active matrix pixel is provided that includes forming a driver device on a first portion of an insulating substrate, in which the driver device includes hydrogenated semiconductor including contact regions that are present on a crystalline semiconductor channel. The hydrogenated semiconductor including contact regions may be formed using a low temperature deposition process. An electrode of an organic light emitting diode is formed on a second portion of the insulating substrate. The electrode is in electrical communication to receive an output from the driver device. At least one passivation layer is formed over the driver device. A switching device comprising at least one amorphous semiconductor layer is formed on the at least one passivation layer. The switching device may be formed over the driver device.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
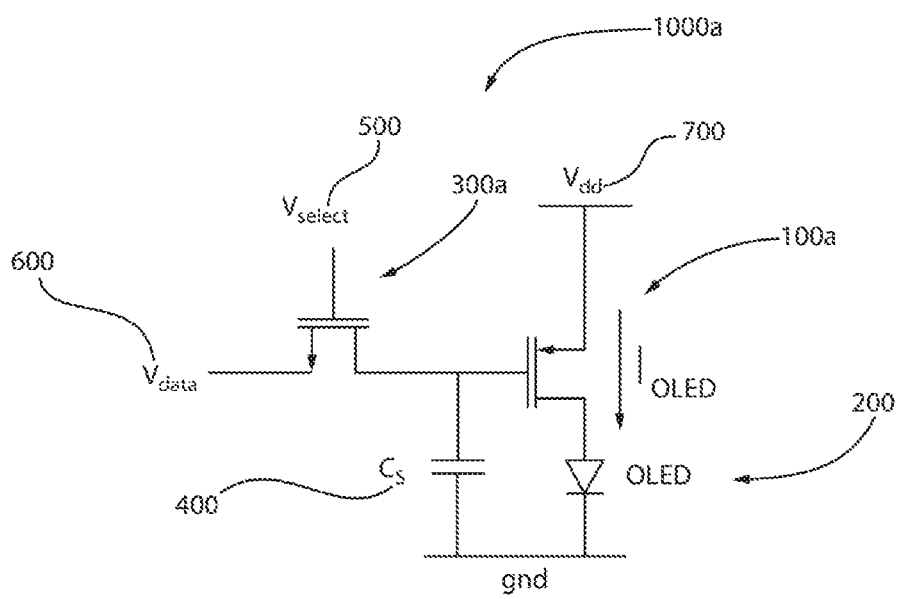
FIG. 1 is a schematic of a pixel circuit for an active matrix organic light emitting diode (AMOLED) including a p-channel JFET or p-channel MOSFET providing the driving device of the OLED pixel that is in contact with the anode of the OLED pixel, and a switching device of a thin film transistor (TFT) including hydrogenated amorphous silicon (a-Si:H), in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein relate to active matrix organic light-emitting diode (AMOLED) displays. An AMOLED display consists of an active matrix of organic light emitting diode (OLED) pixels that generate light (luminescence) upon electrical activation that have been deposited or integrated onto a thin-film-transistor (TFT) array, which functions as a series of switches to control the current flowing to each individual pixel. Each pixel of an AMOLED typically includes a storage capacitor, at least one switching thin film transistor (TFT) and at least one drive thin film transistor (TFT). Typically, the continuous current flow is controlled by at least two TFTs at each pixel (to trigger the luminescence), with one TFT to start and stop the charging of a storage capacitor, i.e., the switching TFT, and at least a second TFT, i.e., drive TFT, to provide a current source at the level needed to create a constant current to the pixel.

A thin-film transistor (TFT) is a kind of field-effect transistor (FET) made by depositing of an active semiconductor layer as well as the dielectric layer and metallic contacts over a supporting substrate. The supporting substrate may be composed of a non-conductive material, e.g., an insulator. A common substrate for a TFT device is glass, because the primary application of TFTs is in liquid-crystal displays. This differs from the conventional transistor, where the semiconductor material typically is the substrate, such as a silicon wafer. TFTs can be made using a wide variety of semiconductor materials. The electrodes, i.e., metallic contacts, may be transparent electrodes, such as indium tin oxide (ITO) electrodes. In some examples, the active semiconductor layers may be provided by amorphous silicon, such as hydrogenated amorphous silicon ($\alpha$-Si:H). A thin-film transistor that includes active semiconductor layers of amorphous silicon may be referred to as amorphous silicon thin film transistor ($\alpha$-Si:H TFT).

Typically, active-matrix liquid crystal displays employ hydrogenated amorphous Si ($\alpha$-Si:H) thin-film transistors (TFTs). The very low off-current of $\alpha$-Si:H TFTs (in spite of low TFT mobility) is one requirement for the switching TFT to avoid the discharge of the storage capacitor over the frame (refresh) time of the pixel. For example, the low off-current provided by an $\alpha$-Si:H TFT as employed as the switching TFT in an active-matrix liquid crystal display may be on the order of 100 fA/μm or less.

Active matrix organic light-emitting diode (AMOLED) displays however require an additional driver TFT to provide a DC current to the OLED. One requirement on the driver TFT is a high drive current, which is challenging due to the low mobility of a-Si:H. For example, the high drive current typically required by the driver device (also referred to as driver transistor) in an AMOLED display may be on the order of 10 nA/μm or greater, which requires voltages of the order of 5V or greater on a driver TFT with a channel width of the order of 100 μm or larger. The required high voltages increases the power consumption and also reduce the long-term reliability of the TFTs. The required large channel widths limit the resolution of the display. The drive current of a TFT is, to the first order, linearly proportional to the TFT mobility. Therefore, a higher TFT mobility would allow smaller channel width and/or lower voltages to achieve the required drive currents.

It has been determined that higher TFT mobilities in the driver device require poly-Si or single-crystalline Si channel materials. Since the hole mobility is significantly lower than electron mobility in a-Si:H; a very low TFT off-current may be achieved without high-quality source/drain junctions, and therefore high growth rates may be used for growing α-Si:H TFTs, which is advantageous for low process costs. However, this is typically not the case in poly-Si or single-crystalline Si. Therefore, achieving low off-currents requires strict process conditions particularly to assure high quality source/drain junctions, which may be too expensive for display applications. In the case of poly-Si, other mechanisms, such as thermionic emission over the grain boundaries, also contribute to the high TFT off-currents.

In some embodiments, the methods and structures disclosed herein provide an AMOLED display structure in which a high mobility device is provided for the drive transistor, while incorporating an α-Si:H TFT for the switching transistor (also referred to as switching device) of the AMOLED display. In some embodiments, the drive transistor is a polysilicon (poly-Si) or single-crystalline silicon (Si) containing semiconductor device, such as a junction field effect transistor (JFET), metal oxide semiconductor field effect transistor (MOSFET), bipolar junction transistor (BJT) or combination thereof. The α-Si:H switching TFT achieves the required low off-current, and a poly-Si or single-crystalline Si driver device achieves the requirement on the high drive current. The driver device does not need to have a low off-current, therefore allowing low process costs. In some embodiments, the α-Si:H TFT is integrated on top of the polycrystalline silicon or single-crystalline Si TFT to improve the fill-factor of the pixel for standard bottom-emission OLEDs. The driver device of polysilicon or single-crystalline semiconductor material may be implemented by low-temperature contacts compatible with the display manufacturing technology, as well as with low-cost flexible substrates.

In one embodiment, the high mobility device for the drive transistor of the AMOLED display pixel is provided by a junction field effect transistor (JFET) with contacts formed using a low temperature deposition process. As used herein, the term "low temperature" is used to describe a deposition process in which the maximum temperature measured at the deposition surface during the deposition process is not greater than 500° C. In some embodiments, a low temperature deposition process is a deposition method in which the maximum temperature measured at the deposition surface during the deposition process is no greater than 250° C. In another embodiment, the high mobility device for the drive transistor of the AMOLED display pixel is provided by a metal oxide semiconductor field effect transistor (MOSFET) with contacts formed using a low temperature deposition process. In a further embodiment of the present disclosure, the high mobility device for the drive transistor of the AMOLED display pixel is provided by a bipolar junction transistor (BJT) with contacts formed using a low temperature deposition process. The methods and structures of the present disclosure are now discussed with more detail referring to FIGS. 1-14.

FIG. 1 depicts one embodiment of a pixel circuit 1000a for an active matrix organic light emitting diode (AMOLED) including a p-channel JFET 100a providing the driving device of the OLED pixel that is in contact with the anode of the OLED pixel 200, and a switching device of a thin film transistor (TFT) 300a that is composed of hydrogenated amorphous silicon (a-Si:H). The pixel circuit 1000a includes a p-channel JFET 100a configured to drive an organic light-emitting diode (OLED) 200 by providing current and/or voltage to an electrode, e.g., anode and/or cathode, of the OLED pixel 200.

The term "junction field-effect transistor (JFET)" refers to a type of field-effect transistor in which the gate structure is comprised of a junction, for example, a p-n junction. The JFET includes a channel of semiconductor material, doped to contain an abundance of positive charge carriers or holes (p-type), or of negative carriers or electrons (n-type). Ohmic contacts at each end form the source region and drain region. A p-n junction is formed on one or both sides of the channel, or surrounding it, using a region with doping opposite to that of the channel, and biased using an ohmic gate contact. Different than a metal oxide semiconductor field effect transistor (MOSFET), the gate structure of a JFET is comprised of a p-n junction wherein one side of the p-n junction (i.e. the p or the n side) is part of the JFET channel and the other side of the p-n junction which is disposed on the said part of the JFET channel is in direct contact with a conductive material that forms the gate contact. During operation, the current flows from the source region of the device to the drain region of the device. As the reverse bias on the gate is increased (positive and negative gate voltage bias in the case of p-channel and n-channel devices, respectively), a region depleted of charge (the depletion region) spreads under the gate junction into the channel region. The depleted region does not support current flow and therefore restricts the current flow as it increases in depth.

The pixel circuit 1000a also includes a pixel capacitor 400. A "capacitor" is a structure including two electrically conductive materials separated and insulated from each other by a dielectric for storing a charge. The electrically conductive materials may be referred to as electrodes and the dielectric may be a node dielectric layer. In some embodiments, a capacitor may further include a semiconductor layer disposed between the dielectric and one of the electrodes. The term "electrode" as used to describe a component of the capacitor represents one of the two electrically conductive materials of the capacitor that are separated by the dielectric layer.

The pixel circuit 1000a depicts the circuit to a single pixel in an array of pixels that are distributed in rows and columns. A row select line 500 ($V_{select}$) and a column data line 600 ($V_{data}$) are interconnected with the plurality of pixel circuits.

Still referring to FIG. 1, in one embodiment, the gate structure of the thin film transistors (TFT) 300a composed of hydrogenated amorphous silicon (a-Si:H) that provides the switching device is coupled to a row select line 500 ($V_{select}$). The source (or drain) region of the thin film transistors (TFT) 300a composed of hydrogenated amorphous silicon (a-Si:H) that provides the switching device is also coupled to a column data line 600 ($V_{data}$). The column data line 600 ($V_{data}$) that provides data signals to the switching device provided by the thin film transistors (TFT) 300a composed of hydrogenated amorphous silicon (a-Si:H).

In operation, the row select line 500 provides a signal ($V_{select}$) to switch on the thin film transistors (TFT) 300a including hydrogenated amorphous silicon (α-Si:H) once during each refresh period of the display. Accordingly, each row is selected for a period equal to the refresh period divided by the number of rows. The column data line 600 provides column data ($V_{data}$) to the source (or drain) of thin film transistors (TFT) 300a including hydrogenated amorphous silicon (a-Si:H) in the selected row. The switching TFT 300a transfers the column data (Vdata) to the drain (or source) of switching TFT 300a, which is connected to the gate of the driver JFET 100a. The column data (Vdata) is stored on the storage capacitor 400 until the next time the pixel is refreshed, i.e., during the entire frame period. The low off-current (i.e. source-drain leakage) of the switching TFT 300a assures a small discharge of the storage capacitor 400 and therefore a small change in the column data (Vdata) stored on the storage capacitor over the frame period (i.e. until the next refresh). As may be appreciated, in some embodiments, the data on each column data line 600 ($V_{data}$) is different between rows for every row selection to provide a corresponding data value to the thin film transistors (TFT) 300a including hydrogenated amorphous silicon (a-Si:H) that provides the switching device in the selected row.

Note in FIG. 1, for the purpose of illustration, the source electrode of the switching TFT 300a is drawn as connected to Vdata and the drain electrode of the switching TFT is drawn as connected to gate of the driver JFET 100a. As known in the art, and by convention, in an N-channel TFT, the denotation of drain and source electrodes is interchangeable depending on the direction of the bias, with the drain electrode having a larger voltage compared to the source electrode. Therefore, if at any point of time, the Vdata is smaller than the voltage on the storage capacitance, the electrode connected to Vdata is the source and the electrode connected to the storage capacitor is the drain (as illustrated in FIG. 1). In contrast, if at any point in time, Vdata is larger than the voltage on the storage capacitor, the electrode connected to Vdata is the drain and the electrode connected to the storage capacitor is the source (opposite to the illustration of FIG. 1).

In order to provide a drive current to the OLED, the pixel circuit needs a driver device, e.g., a p-channel JFET 100a, in addition to the switching device, i.e., the thin film transistors (TFT) 300a composed of hydrogenated amorphous silicon (a-Si:H), and an appropriate storage capacitor, i.e., pixel capacitor 400. Specifically, when the select voltage ($V_{select}$) is high, the switching device, i.e., the thin film transistors (TFT) 300a including hydrogenated amorphous silicon (a-Si:H), is on and data voltage ($V_{data}$) from the column data line 600 connected to the source (or drain) region of the switching device passes through the switching device and is written onto (stored in) the storage capacitor 400, until the gate voltage that is applied to the gate structure of the driver device, i.e., p-channel JFET 100a, substantially equals (or becomes very close to) the data line voltage ($V_{data}$). The driver device, i.e., p-channel JFET 100a, allows corresponding current ($I_{OLED}$) to flow from the source line (VDD) 700 through the driver device, i.e., p-channel JFET 100a, to the common cathode (Ground) of pixel OLED 200.

The OLED pixel 200 can then emit light, e.g., OLED is turned on. The current level to the OLED pixel 200 controlled by the gate voltage of the driver device, i.e., p-channel JFET 100a, and the current source is programmed by setting the gate voltage of driver device, i.e., p-channel JFET 100a. This is achieved during a short addressing time of about 65 microseconds, in some embodiments, when the switching device, i.e., the thin film transistors (TFT) 300a including hydrogenated amorphous silicon (a-Si:H), is turned on. When the select voltage ($V_{data}$) is low, the switching device, i.e., thin film transistors (TFT) 300a including hydrogenated amorphous silicon (a-Si:H), is OFF and the stored (programmed) voltage, i.e., charge stored in the pixel capacitor 400, will determine the amount of current flow through the OLED pixel 200. Therefore, if there is negligible change in the stored or programmed voltage (as assured by low off current of the switching TFT 300a), essentially the same amount of current should flow from the power or source line ($V_{dd}$) through the driver device, e.g., p-type JFET 100a, to the pixel OLED 200 (cathode or ground), producing a continuous pixel light emission with a negligible change in brightness over the frame time (i.e. until next pixel refresh).

The pixel circuit 1000a that is depicted in FIG. 1 includes a driver device of a p-channel JFET 100a with a crystalline channel and contact regions formed using a low temperature deposition process, and a switching device of an n-type thin film transistors (TFT) 300a including at least one layer of hydrogenated amorphous silicon (a-Si:H). For optimum performance of the pixel circuit 1000a, the switching device 300a typically has a very low off-current of α-Si:H TFTs (in spite of low TFT mobility) to avoid the discharge of the storage capacitor over the frame (refresh) time of the pixel, and the p-type JFET 100a, i.e., driver device, has a high drive current. For example, the low off-current provided by an α-Si:H TFT switching device in an AMOLED display may range from 10 fA/μm to 1 pA/μm. For example, the high drive current typically required by the p-channel JFET 100a driver device in an AMOLED display may range from 10 nA/μm to 1 μA/μm.

In FIG. 1, the driver device, i.e., the p-channel JFET 100a, is connected to the anode of the OLED pixel 200. In some embodiments, direct programming of the circuit may be employed with the following equation:

$$I_{OLED} \approx I_{DSS}(1-(V_{dd}-V_{data})/|V_P|)^2 \quad (1)$$

where $I_{OLED}$ is the current passed to the anode of the OLED, $I_{DSS}$ is to the drain saturation current of the p-channel JFET 100a, $V_{dd}$ is the power supply voltage, $V_{data}$ is the data line voltage, and $V_P$ is the pinch off voltage of the p-type JFET 100a ($|V_P|$ refers to absolute value of $V_p$). Direct programming means the circuit can set the OLED current ($I_{OLED}$) independent of the I-V characteristics of the OLED, i.e., the OLED current determined by the circuit does not depend on the OLED voltage. This is the case as the OLED voltage ($V_{OLED}$) is not a variable in Equation (1).

Figure 2:
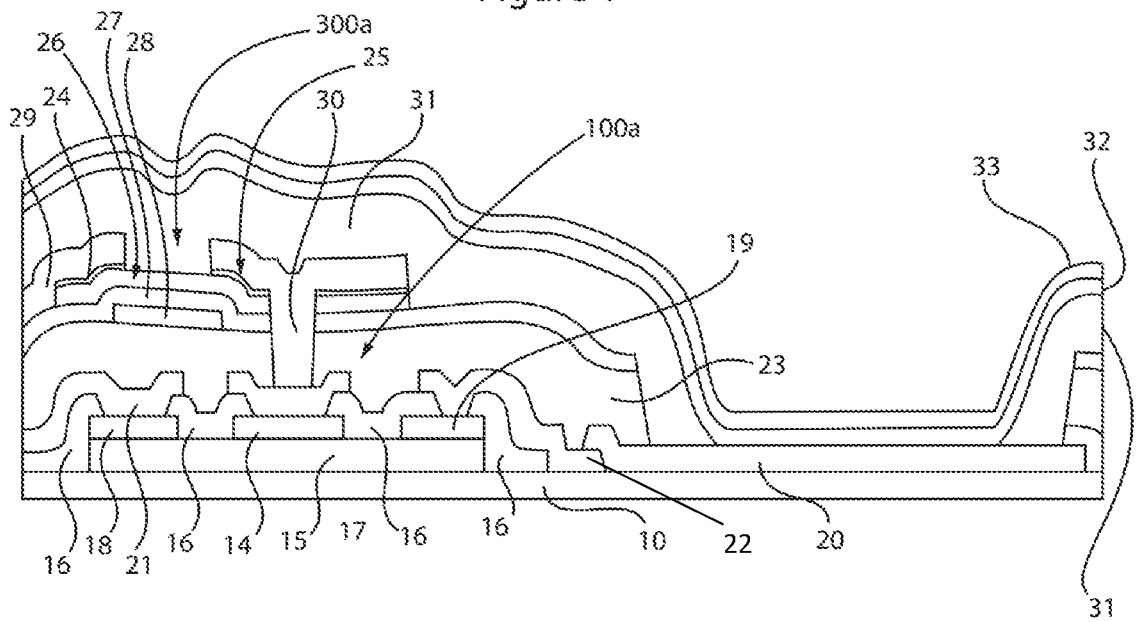
FIG. 2 is a side cross-sectional view depicting a backplane of an active matrix organic light emitting diode (AMOLED), in which the switching thin film transistor (TFT) is a TFT device including hydrogenated amorphous silicon (a-Si:H) having a bottom-gate staggered structure that are present over a JFET or BJT that provides the driving device of the pixel, in which the JFET or BJT is in contact with the anode of the AMOLED pixel, in accordance with one embodiment of the present disclosure.

FIG. 2 depicts one embodiment of a backplane of an active matrix organic light emitting diode (AMOLED), in which the switching thin film transistors (TFT) 300a including hydrogenated amorphous silicon (a-Si:H) is present over a JFET 100a that provides the driving device of the pixel, in which the JFET 100a is in contact with anode electrode 20 of the OLED. In this embodiment, the TFT 300a has a bottom-gate staggered structure. Bottom-gate refers to a structure where gate is positioned on the bottom of the channel. Staggered refers to a structure wherein the source and drain contacts are positioned on a side of the channel opposite to the side where the gate is positioned, i.e. in a bottom-gate staggered structure, the gate is disposed on the bottom side of the channel, while the source and drain are disposed on the top. Bottom-gate structures are also known as inverted structures. In some embodiments, the switching TFT may have a top-gate staggered structure. Top gate refers to the gate being disposed on top of the channel. Although not depicted in FIG. 2, the pixel circuit for the AMOLED also includes a pixel capacitor in addition to the switching thin film transistor (TFT) 300a that is composed of hydrogenated amorphous silicon (a-Si:H) and the JFET 100a that provides the driving device of the pixel, as depicted in FIG. 1.

Referring to FIG. 2, the active matrix organic light emitting diode (AMOLED) is typically formed on a substrate 10, which may be an insulating substrate, such as glass, or plastic; or metal foil with an insulating coating. The substrate 10 may be a rigid or flexible substrate. A transparent medium, such as glass or clear plastic, is typically selected for display applications with typical bottom-emission OLEDs, the substrate 10 may also be composed of non-transparent or semi-transparent materials, including plastic, semiconductors, metal foil or a combination thereof. The thickness of the substrate 10 can be from 1 m to about 1 mm. Other thicknesses that are lesser than, or greater than, the aforementioned thickness range can also be employed as the thickness of the insulating substrate 10.

The JFET 100a may be present on a portion of the substrate 10. In some embodiments, the JFET 100a includes a gate junction 14 of a second conductivity type located on, i.e., in direct contact with, a surface of a crystalline semiconductor material 15 of a first conductivity type. In one embodiment, the gate junction 14 includes a doped hydrogenated crystalline semiconductor material layer portion of a second conductivity type which is opposite the first conductivity type of the underlying crystalline semiconductor material 15. In this embodiment, the gate junction may further include a non-crystalline hydrogenated semiconductor material, which is either undoped or doped to the same conductivity type as that of the doped hydrogenated crystalline semiconductor, and disposed between the doped hydrogenated crystalline semiconductor and the gate electrode. If employed, in some embodiments, the non-crystalline hydrogenated material improves the surface passivation of the doped hydrogenated crystalline material and reduces the reverse saturation current of the gate junction. In another embodiment, the gate junction is comprised of a hydrogenated non-crystalline semiconductor of a second conductivity type which opposite the first conductivity type of the underlying crystalline semiconductor material 15. In this embodiment, the gate junction may further include an undoped non-crystalline semiconductor material disposed between the doped non-crystalline hydrogenated semiconductor material and the substrate. If employed, in some embodiments, the non-crystalline undoped hydrogenated material improves the surface passivation of the crystalline substrate and reduces the reverse saturation current of the gate junction. The term "conductivity type" denotes whether a semiconductor material has been doped to an n-type or p-type conductivity type. For example, when a first conductivity type is "n-type", the second conductivity type is "p-type". When the first conductivity type is "p-type", the second conductivity type is "n-type".

The term "crystalline" is used throughout the present disclosure to denote a single crystalline material, a multi-crystalline material or a polycrystalline material. Typically, the crystalline semiconductor material that is employed in the present disclosure is comprised of a single crystalline semiconductor material. The term "single crystalline" denotes a crystalline solid, in which the crystal lattice of the entire sample is substantially continuous and substantially unbroken to the edges of the sample, with substantially no grain boundaries. In another embodiment, the crystalline semiconductor material of the JFET 100a, such as the crystalline semiconductor material 15 and/or the the gate junction 14, is of a multi-crystalline or polycrystalline structure. Contrary to a single crystal crystalline structure, a polycrystalline structure is a form of semiconductor material made up of randomly oriented crystallites and containing large-angle grain boundaries, twin boundaries or both. Multi-crystalline is widely referred to a polycrystalline material with large grains (of the order of millimeters to centimeters). Other terms used are large-grain polycrystalline, or large-grain multi-crystalline. The term polycrystalline typically refers to small grains (hundreds of nanometers, to hundreds of microns). The term "non-crystalline" is used throughout the present disclosure to denote an amorphous, nano-crystalline or micro-crystalline material.

In one embodiment, the crystalline semiconductor material 15 of the first conductivity type that can be employed in the present disclosure can be a type IV semiconductor which includes at least one element from Group IVA (i.e., Group 14) of the Periodic Table of Elements. For example, the crystalline semiconductor material may be silicon (Si), such as single crystalline silicon. The crystalline semiconductor material 15 may be silicon-carbon (SiC), and/or silicon-germanium (SiGe) alloy.

In one embodiment, the crystalline semiconductor material 15 of the first conductivity type that can be employed in the present disclosure can be an III-V compound semiconductor which includes at least one element from Group IIIA (i.e., Group 13) of the Periodic Table of Elements and at least one element from Group VA (i.e., Group 15) of the Periodic Table of Elements. The range of possible formulae for suitable III-V compound semiconductors that can be used in the present disclosure is quite broad because these elements can form binary (two elements, e.g., gallium (Ill) arsenide (GaAs)), ternary (three elements, e.g., indium gallium arsenide (InGaAs)) and quaternary (four elements, e.g., aluminum gallium indium phosphide (AlInGaP)) alloys. In other embodiments, the substrate is comprised of a II-VI semiconductor.

In another embodiment of the present disclosure, the crystalline semiconductor material 15 of the first conductivity type can be a semiconductor material having the formula $Si_yGe_{1-y}$ wherein y is $0 \leq y \leq 1$. In some embodiments, in which y is 1, the crystalline semiconductor material 15 of the first conductivity type can be comprised entirely of Si. In another embodiment, in which y is 0, the crystalline semiconductor material 15 of the first conductivity type can be comprised entirely of Ge. In yet another embodiment and when y is other than 0 or 1, the crystalline semiconductor material 15 of the first conductivity type can be comprised entirely of a SiGe alloy.

In yet another embodiment of the present disclosure, the crystalline semiconductor material 15 of the first conductivity type can be a semiconductor material comprised of SiC.

In some embodiments of the present disclosure, the crystalline semiconductor material 15 may include nitrogen, oxygen, fluorine, deuterium, chlorine or any combination thereof. When present, the concentration of the aforementioned species can be from 1 atomic % to 10 atomic %. Other concentrations that are lesser than, or greater than, the aforementioned concentration range can also be present.

In the embodiment that is depicted in FIG. 2, the first conductivity type of the crystalline semiconductor material 15 of the present disclosure is p-type. As used herein, "p-type" refers to the addition of impurities to an intrinsic semiconductor that creates deficiencies of valence electrons (i.e., holes). In a Si-containing semiconductor material, examples of p-type dopants, i.e., impurities, include but are not limited to, boron, aluminum, gallium and indium. In one embodiment, in which the first conductivity type of the crystalline semiconductor material 15 of the present disclosure is p-type, the p-type dopant is present in a concentration ranging from $1 \times 10^9$ atoms/cm$^3$ to $1 \times 10^{20}$ atoms/cm$^3$. In another embodiment, in which the first conductivity type of the crystalline semiconductor material 15 of the present disclosure is p-type, the p-type dopant is present in a concentration ranging from $1 \times 10^{14}$ atoms/cm$^3$ to $1 \times 10^{19}$ atoms/cm$^3$. Although not depicted in FIG. 2, the conductivity type of the crystalline semiconductor material 15 may also be n-type. As used herein, "n-type" refers to the addition of impurities that contributes free electrons to an intrinsic semiconductor. In a Si-containing semiconductor, examples of n-type dopants, i.e., impurities, include but are not limited to, antimony, arsenic and phosphorous. In one embodiment, in which the first conductivity type of the crystalline semiconductor material 15 of the present disclosure is n-type, the n-type dopant is present in a concentration ranging from $1\times10^9$ atoms/cm$^3$ to $1\times10^{20}$ atoms/cm$^3$. In another embodiment, in which the first conductivity type of the crystalline semiconductor material 15 of the present disclosure is n-type, the n-type dopant is present in a concentration ranging from $1\times10^{14}$ atoms/cm$^3$ to $1\times10^{19}$ atoms/cm$^3$.

The dopant concentration that provides the first conductivity type within the crystalline semiconductor material 15 of the present disclosure may be graded or uniform. By "uniform" it is meant that the dopant concentration is the same throughout the entire thickness of the crystalline semiconductor material 15. For example, a crystalline semiconductor material 15 of the first conductivity type having a uniform dopant concentration may have the same dopant concentration at the upper surface and bottom surface of the semiconductor material, as well as the same dopant concentration at a central portion of the semiconductor material between the upper surface and the bottom surface of the crystalline semiconductor material 15 of the first conductivity type. By "graded" it is meant that the dopant concentration varies throughout the thickness of the crystalline semiconductor material 15 of the first conductivity type. For example, a crystalline semiconductor material 15 of the first conductivity type having a graded dopant concentration may have an upper surface with a greater dopant concentration than the bottom surface of the a crystalline semiconductor material 15 of the first conductivity type, and vice versa.

The first conductivity type can be introduced during the growth of the crystalline semiconductor material that can be used as element 15 of the present disclosure. Alternatively, the first conductivity type can be introduced into an intrinsic crystalline semiconductor material by utilizing ion implantation, and/or gas phase doping, and the doped crystalline semiconductor material can be employed as the crystalline semiconductor material 15 of the first conductivity type. The thickness of the crystalline semiconductor material 15 of the first conductivity type can be from 3 nm to 3 µm. Other thicknesses that are lesser than, or greater than, the aforementioned thickness range can also be employed for the thickness of the crystalline semiconductor material 15 of the first conductivity type.

Each of the JFET 100a also includes the gate junction 14 that is located on a surface of the crystalline semiconductor material 15 of the first conductivity type. In one embodiment, the gate junction 14 comprises a doped hydrogenated crystalline semiconductor material of a second conductivity type. The material layer of the gate junction 14 has a conductivity type that is opposite the conductivity type of the crystalline semiconductor material 15 that the gate junction 14 is in direct contact with. For example, if the first conductivity type of the crystalline semiconductor material 15 is p-type, the conductivity type of the gate junction 14 will be n-type.

In some embodiments, the doped hydrogenated crystalline semiconductor material layer of the gate junction 14 may comprise a same or different semiconductor material as that of the crystalline semiconductor material 15. In one embodiment, the doped hydrogenated crystalline semiconductor material layer of the gate junction 14 is composed of silicon, such as single crystal silicon. In another embodiment, the doped hydrogenated crystalline semiconductor material layer of the gate junction 14 has a formula $Si_xGe_{1-x}$ wherein x is $0\leq x\leq 1$. As such, the doped hydrogenated crystalline semiconductor material layer of the gate junction 14 may comprise Si (when x is 1), Ge (when x is 0), or a SiGe (when x is other than 1, or 0).

In accordance with the present disclosure, the doped hydrogenated crystalline semiconductor material layer of the gate junction 14 contains from 5 atomic % to 40 atomic % hydrogen therein. In one embodiment, the doped hydrogenated crystalline semiconductor material layer of the gate junction 14 contains from 10 atomic % to 25 atomic % hydrogen therein. In yet another embodiment, the doped hydrogenated crystalline semiconductor material layer of the gate junction 14 contains from 20 atomic % to 30 atomic % hydrogen therein. In some embodiments of the present disclosure, the doped hydrogenated crystalline semiconductor material layer portion 14 may include carbon, nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

The dopant that is contained within the doped hydrogenated crystalline semiconductor material layer of the gate junction 14 can be a p-type dopant or an n-type dopant. In a Si-containing doped hydrogenated crystalline semiconductor material layer of the gate junction 14 examples of p-type dopants, i.e., impurities, include but are not limited to, boron, aluminum, gallium and indium. In one embodiment, in which the doped hydrogenated crystalline semiconductor material layer of the gate junction 14 includes a p-type dopant, the p-type dopant is present in a concentration ranging from $10^{16}$ atoms/cm$^3$ to $10^{21}$ atoms/cm$^3$. In a Si-containing doped hydrogenated crystalline semiconductor material layer of the gate junction 14, examples of n-type dopants, i.e., impurities, include but are not limited to, antimony, arsenic and phosphorous. In one embodiment, in which the doped hydrogenated crystalline semiconductor material layer of the gate junction 14 contains an n-type dopant, the n-type dopant is present in a concentration ranging from $10^{16}$ atoms/cm$^3$ to $10^{21}$ atoms/cm$^3$. The thickness of the doped hydrogenated crystalline semiconductor material layer of the gate junction 14 may range from 2 nm to 100 nm, and in some embodiments ranges from 5 nm to 15 nm.

The doped hydrogenated crystalline semiconductor material layer of the gate junction 14 has the same (or nearly the same) crystalline characteristics as the crystalline semiconductor material 15. Thus, the doped hydrogenated crystalline semiconductor material layer of the gate junction 14 can have an epitaxial relationship with the crystalline semiconductor material 15.

In some embodiments, the JFET 100a depicted in FIG. 2 also includes a gate electrode 17 located atop the gate junction 14. In one embodiment, the gate electrode 17 is located directly on a surface of the doped hydrogenated crystalline semiconductor material layer of the gate junction 14. The gate electrode 17 can be comprised of a conductive material including, for example, a doped Si-containing material, a conductive metal, a conductive metal alloy comprising at least two conductive metals, a conductive metal nitride, a transparent conductive oxide and/or a conductive metal silicide.

Examples of conductive metals that can be used include, for example, Cu, W, Pt, Al, Pd, Ru, Ni, and Ir. The gate electrode 17 can have a thickness from 1 nm to 1000 nm.

Other thicknesses that are lesser than, or greater than, the aforementioned thickness range can also be employed as the thickness for the gate electrode 17.

Referring to FIG. 2, the JFET 100a may also include a source region contact 18 located on a first side of the gate junction 14 and having a bottommost surface in contact with the surface of the crystalline semiconductor material 15, and a drain region contact 19 located on second side of the gate junction 14 that is opposite to the first side and having a bottommost surface in contact with the surface of the crystalline semiconductor material 15. As shown, the source region contact 18 and the drain region contact 19 are disjoined and are not in direct physical contact with the gate junction 14.

In one embodiment, the source region contact 18 and the drain region contact 19 are each comprised of a doped hydrogenated crystalline semiconductor material of the first conductivity type. The conductivity type of the source region contact 18 and the drain region contact 19 is selected to be opposite the conductivity type of the gate junction 14. In this embodiment, the doped hydrogenated crystalline semiconductor material of the first conductivity type that provides the source region contact 18 and the drain region contact 19 may comprise a same or different, typically a same, semiconductor material as the doped hydrogenated crystalline semiconductor material layer of the gate junction 14.

In one embodiment, the source region contact 18 and the drain region contact 19 comprising the doped hydrogenated crystalline semiconductor material of the first conductivity type have a higher conductivity than the crystalline semiconductor material 15. In some embodiments, the source and drain regions are comprised of polycrystalline materials doped to the same conductivity type as and having a higher conductivity than the crystalline substrate. In other embodiments, the source and drain regions are comprised of polycrystalline materials doped to the same conductivity type as and having a higher conductivity than the crystalline substrate. In some embodiments, a higher conductivity can be achieved by a higher active doping concentration. For example, the dopant concentration that provides the conductivity type of the source region contact 18 and the drain region contact 19 may range from $10^{18}$ atoms/cm$^3$ to $10^{21}$ atoms/cm$^3$.

In some embodiments, the source and drain regions are comprised of silicide. In some embodiments, the source and drain regions are omitted and the source and drain electrodes form sufficiently ohmic contacts with the crystalline substrates. In such embodiments, when the crystalline substrate is comprised of an n-type semiconductor, the source and drain electrodes are preferably comprised of a low work function conductive material, and when the crystalline substrate is comprised of a p-type semiconductor, the source and drain electrodes are preferably comprised of a high work function conductive material to ensure good ohmic contacts with the substrate. Examples of high work function metals include but not limited to Cr, Pt, Pd, Au, Ni and combinations thereof. Examples of low work function electrodes include but not limited to Er, Mg and combinations thereof.

The doped hydrogenated crystalline semiconductor material that can be used as the source region contact 18 and the drain region contact 19 can have a hydrogen concentration that is the same or different, typically the same, as that of the doped hydrogenated crystalline semiconductor material layer of the gate junction 14. In one embodiment, the doped hydrogenated crystalline semiconductor material that can be used as the source region contact 18 and the drain region contact 19 can have a hydrogen concentration from 5 atomic % to 40 atomic %.

In some embodiments, portions of a passivation material layer 16 can be located on each side of the gate junction 14 and on each side of each of the source region contact 18 and the drain region contact 19. In such an embodiment, one of the portions of the passivation material layer 16 separates the source region contact 18 from the first side of the gate junction 14, and another portion of the passivation material layer 16 separates the drain region contact 19 from the second side of the gate junction 14. In some embodiments, a driver source electrode 21 may be formed to the source region contact 18, and a driver drain electrode 22 may be formed to the drain region contact 19. The driver source electrode 21 and the driver drain electrode 22 may be composed of a similar conductive material as the gate electrode 17. Therefore, the above description of the possible compositions for the gate electrode 17 is suitable for the description of the driver source electrode 21 and the driver drain electrode 22. The driver drain electrode 22 may extend from the drain region contact 19 over a portion of the passivation material layer 16 to the anode electrode 20 of the OLED pixel.

Still referring to FIG. 2, the anode electrode 20 of the OLED pixel is present on a portion of the insulating substrate 10 that is adjacent to the portion of the insulating substrate 10 that the crystalline semiconductor material 15 of the JFET 100a is present on. The anode electrode 20 removes electrons (adds "holes") when a current flows through the OLED pixel. The anode electrode 20 of the OLED pixel may be comprised of a transparent conductive material, such as a transparent conductive oxide. Examples include but are not limited to indium-tin-oxide (ITO), fluorine doped tin-oxide and aluminum-doped zinc-oxide (AZO). The thickness of the anode electrode 20 may range from 25 nm to 500 nm, although thinner or thicker layers may be also employed.

A second passivation layer 23 is present over the JFET 100a that provides the driver device for the AMOLED pixel. The second passivation layer 23 may be present on a portion of the anode electrode 20, but at least a portion of the anode electrode 20 is not covered by the second passivation layer 23 so that the anode electrode 20 may be in contact with at least one organic layer of the OLED pixel. The second passivation layer 23 is typically composed of a dielectric material, such as an oxide, nitride or oxynitride material. The second passivation layer 23 is similar to the first passivation layer 16. Therefore, the above description for the composition of the first passivation layer 16 is suitable for the description of the second passivation layer 23. For examples, the second passivation layer 23 may be composed of silicon oxide ($SiO_2$).

The switching thin film transistors (TFT) 300a including hydrogenated amorphous silicon (a-Si:H) is present on the second passivation layer 23 overlying at least a portion of the JFET 100a that provides the driver device for the AMOLED pixel. In one embodiment, the switching thin film transistor (TFT) including the hydrogenated amorphous silicon is composed of a source region 24, a drain region 25, a channel region 26, a gate dielectric 27 and a gate conductor 28. The gate conductor 28 may be formed directly on a portion of the second passivation layer 23. In some embodiments, the gate conductor 28 of the switching thin film transistors (TFT) 300a is composed of a conductive metal. Examples of conductive metals that can be used for the gate conductor 28 of the switching thin film transistors (TFT)

300a include, for example, Cr, Al, Ti, Pd, Cu, and combinations thereof. The gate conductor 28 can have a thickness from 1 nm to 1000 nm.

The gate dielectric 27 is positioned between the gate conductor 28 and the channel region 26 of the switching thin film transistors (TFT) 300a. In the example depicted in FIG. 2, the gate dielectric layer 27 is blanket deposited over the gate conductor 28 and is present on the upper surfaces of the second passivation layer 23. The gate dielectric 27 may be composed of any dielectric material including oxides, nitrides and oxynitrides. In one embodiment of particular interest, the gate dielectric is composed of hydrogenated amorphous (a-SiNx:H) silicon nitride deposited by plasma-enhanced chemical vapor deposition (PECVD). However, the gate dielectric 27 may be composed of other dielectric materials such as hydrogenated amorphous silicon oxide (a-SiO$_x$:H), hydrogenated amorphous silicon oxynitride (a-SiO$_x$N$_y$:H), high-k dielectrics, such as TiO$_2$, Al$_2$O$_3$, ZrO$_2$, HfO$_2$, Ta$_2$O$_5$, La$_2$O$_3$, and other like oxides including perovskite-type oxides. The gate dielectric 27 may be composed of single material layer or may be a multi-layered structure including any combination of the aforementioned dielectric materials.

The channel region 26 of the switching thin film transistors (TFT) 300a is typically composed of an intrinsic amorphous semiconductor material. In one embodiment, an amorphous semiconductor material is a non-crystalline material that lacks the long-range order characteristic of a crystal. An "intrinsic" semiconductor, also called an undoped semiconductor or i-type semiconductor, is a pure semiconductor without any significant dopant species present.

In some embodiments, the channel region 26 of the switching thin film transistors (TFT) 300a is composed of a semiconductor material that is hydrogenated. For example, the channel region 26 may include 5 atomic % to 40 atomic % hydrogen therein. In one embodiment, the semiconductor material layer of the channel region 26 contains from 10 atomic % to 25 atomic % hydrogen therein. In some embodiments of the present disclosure, the channel region 26 may further include carbon, nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

In one embodiment, the amorphous semiconductor layer of the channel region 26 may be composed of amorphous hydrogenated silicon (a-Si:H). Other examples of amorphous semiconductors that may be used as the amorphous semiconductor layer of the channel region 26 may include α-SiGe:H, α-Ge:H, α-SiC:H, and combinations thereof, wherein 'α' is amorphous and 'H' is hydrogenated.

The source region 24 and drain region 25 of the switching thin film transistors (TFT) 300a are also composed of an amorphous semiconductor material. The source region 24 and the drain region 25 are doped to either an n-type or p-type conductivity. For example, a thin film transistor (TFT) with n-type source and drain region is typically referred to as an n-channel TFT, whereas a thin film transistor (TFT) with a p-type source and drain region is typically referred to as a p-channel TFT. The drain region of the TFT is the doped region located at the end of the channel, in which carriers are flowing out of the transistor through the drain. The source region of the TFT is the doped region located at the opposite end of the channel as the drain region, in which majority carriers are flowing into the channel. In some examples, the amorphous semiconductor material of the source region 24 and drain region 25 of the switching TFT 300a may be hydrogenated. For example, the doped hydrogenated semiconductor material layer employed for the source region 24 and the drain region 25 may contain from 10 atomic % to 25 atomic % hydrogen therein. In some embodiments of the present disclosure, the doped hydrogenated amorphous, nanocrystalline or microcrystalline semiconductor material of the source region may include carbon, nitrogen, oxygen, fluorine, deuterium, chlorine or any combination thereof. When present, the concentration of the aforementioned species can be from 1 atomic % to 10 atomic percent. Other concentrations that are lesser than, or greater than, the aforementioned concentration range can also be present.

In some embodiments, the amorphous semiconductor material that provides the source region 24 and the drain region 25 of the switching TFT 300a may be hydrogenated amorphous silicon (α-Si:H) that is doped to an n-type conductivity. In addition to hydrogenated amorphous silicon (α-Si:H), the amorphous semiconductor material that provides the source region 24 and the drain region 25 of the switching TFT 300a may also be α-Ge:H, α-SiGe:H, α-SiC:H and combinations thereof, wherein 'a' is amorphous and 'H' is hydrogenated. In other embodiments, the source and drain regions 24 and 25 are comprised of nano-crystalline or microcrystalline materials, e.g. nc-Si:H, nc-Ge:H, nc-SiGe:H, nc-SiC:H, μc-Si:H, μc-Ge:H, μc-SiGe:H, μc-SiC:H and combinations thereof. The source and drain material may also be of poly-crystalline form. In some embodiments, the source and drain regions may be formed of a silicide, e.g. by depositing Cr as the source and drain electrodes on the α-Si:H channel and annealing at temperatures below 400° C. for silicidation.

The dopant that provides the conductivity type for the source region 24 and the drain region 25 of the switching TFT 300a is typically an n-type dopant. As used herein, "n-type" refers to the addition of impurities that contributes free electrons to an intrinsic semiconductor. In a silicon containing substrate, examples of n-type dopants, i.e., impurities, include but are not limited to phosphorous, antimony, arsenic. The concentration of n-type dopant that is present in the source region 24 and the drain region 25 of the switching TFT 300a typically ranges from $10^{18}$ atoms/cm$^3$ to $10^{21}$ atoms/cm$^3$.

A switching source electrode 29 may be present in direct contact with the source region 24 of the switching TFT 300a, and a switching drain electrode 30 may be present in direct contact with the drain region 25 of the switching TFT. The switching drain (or source) electrode 30 may also be in direct contact with the gate electrode 17 of the driver device, i.e., JFET 100a. Therefore, the switching drain (or source) electrode 30 provides for electrical communication between the switching TFT 300a that is composed of hydrogenated amorphous silicon (a-Si:H) and the JFET 100a that provides the driver device for the AMOLED pixel. The switching drain (or source) electrode 30 includes a via portion that extends through the second passivation layer 23.

Referring to FIG. 2, a third passivation layer 31 is present over the switching TFT 300a. The third passivation layer 31 is similar to the first and second passivation layers 16, 23 that are described above. For example, the third passivation layer 31 is typically composed of a dielectric material, such as an oxide, nitride or oxynitride material. Therefore, the above description for the composition of the first passivation layer 16 and the second passivation layer 23 is suitable for the description of the third passivation layer 31. In one example, the third passivation layer 31 is composed of silicon oxide ($SiO_2$). In another embodiment, the third passivation layer is comprised of a polymeric material, such as a photoresist. In one embodiment, a photo-resist reflow process is performed by annealing at temperatures in the range of 100-200° C., in some embodiments, after patterning the photoresist to smooth out the patterned edges of the photoresist and avoid shorts between the anode and cathode of the OLED.

Figure 3:
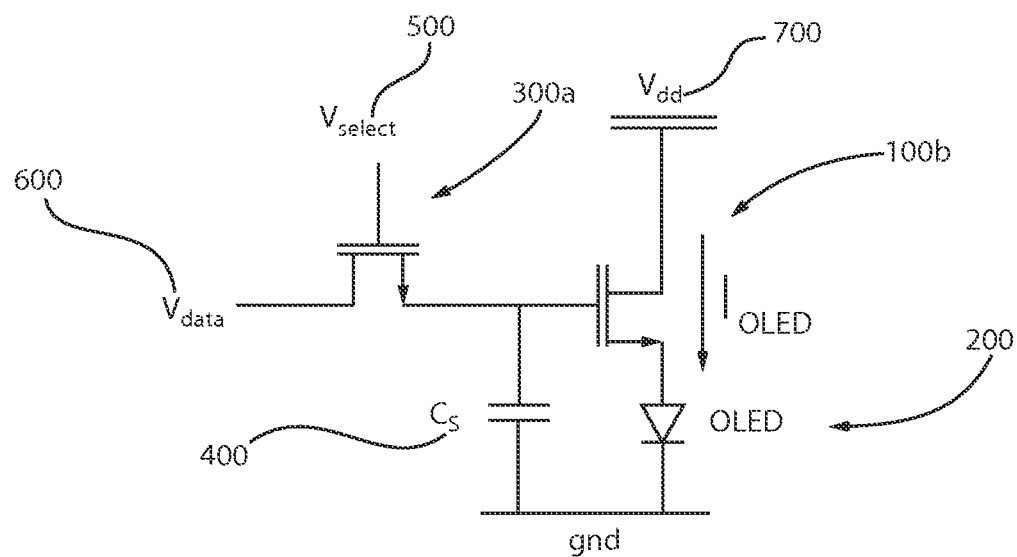
FIG. 3 is a schematic of a pixel circuit for an active matrix organic light emitting diode (AMOLED) including an n-channel JFET or n-channel MOSFET providing the driving device of the AMOLED pixel that is in contact with the anode of an OLED, and a switching device of a thin film transistor (TFT) including hydrogenated amorphous silicon (a-Si:H), in accordance with one embodiment of the present disclosure.

The organic material layers 32 of the organic light emitting diode (OLED) is present over the third passivation layer 31 and is in direct contact with the anode electrode 20, as depicted in FIGS. 2 and 3. The organic material layers 32 may include conducting polymers selected from the group consisting of polyacetylenes (PA), polyanilines (PANI), polypyrroles (PPy), polythiophenes (PT), poly-para-phenylenes (PPP), poly-para-phenylene-vinylenes (PPV) and combinations thereof. The organic material layers 32 may also include oligomers and small molecules, such as oligoacenes, oligothiophenes, triarylamines, oligo-para-phenylenes and combinations thereof. The organic material layers 32 may include at least one hole transport layer and at least one electron transport/emissive layer having a composition selected from the group consisting of N,N'-Bis(naphthalen-1-yl)-N,N'-bis(phenyl)benzidine ($C_{44}H_{32}N_2$) (NPB), 2-TNATA,4,4',4'-Tris-(N-(naphthylen-2-yl)-N-phenylamine)triphenylamine ($C_{66}H_{48}N_4$)(TNATA), Tris(4-carbazoyl-9-ylphenyl)amine ($C_{54}H_{36}N_4$) (TCTA), 1,3,5-tris[4-(diphenylamino)phenyl]-benzene (TDAPB), TDATA, Tris(8-hydroxyquinolinato)aluminum ($Al(C_9H_6NO)_3$) (Alq3), Bis(2-methyl-8-quinolinolato-N1,O8)-(1,1'-Biphenyl-4-olato)aluminum ($C_{32}H_{25}AlN_2O_3$) (Balq), 4,4'-Bis(N-carbazolyl)-1,1'-biphenyl ($C_{36}H_{24}N_2$)(CBP) and combinations thereof. In some embodiments, each layer of the organic material layers that provide the at least one hole transport layer and the at least one electron transport/emissive layer may have a thickness ranging from 1 nm to 25 nm.

A cathode electrode 33 may be present on the organic material layers 32. The cathode electrode 33 may or may not be transparent. In some embodiments, the cathode 33 may be semi-transparent. The cathode electrode 33 injects electrons when a current flows through the device. The cathode electrode 33 of the OLED pixel may be comprised of a transparent conductive material, such as a transparent conductive oxide. Examples include but are not limited to indium-tin-oxide (ITO), fluorine doped tin oxide and aluminum-doped zinc-oxide (AZO). In some embodiments, the thickness of the cathode electrode 33 may range from 10 nm to 500 nm.

In the embodiments depicted in FIGS. 1 and 2, the driving device is a JFET 100a having a p-type channel conductivity, in which the drain (or source) region of the JFET 100a is in electrical communication with the anode electrode 20 of the OLED pixel. The present disclosure in not limited to only this example. For example, embodiments have been contemplated in which a driving device 100b having an n-type conductivity is substituted for the JFET 100a having the p-type conductivity, as depicted in the pixel circuit diagram illustrated in FIG. 3. For example, the driving device 100b may be an n-channel JFET 100b. The n-channel JFET 100b is similar to the p-channel JFET 100a that have been described above with respect to FIGS. 1 and 2. Therefore, the description of the components of the p-channel JFET 100a, such as the gate junction 14, the source region contact 18, the drain region contact 19 and the crystalline semiconductor material 15, are suitable for these components in the n-channel JFET 100b, with the exception that the source region contact, the drain region contact and the crystalline semiconductor material are doped to an n-type conductivity in the n-type JFET 100b and the gate junction of the n-type JFET 100b is doped to a p-type conductivity. The switching TFT 300a including hydrogenated amorphous silicon (a-Si:H) and the pixel capacitor 400 that are depicted in FIG. 3 have been described above with reference to FIGS. 1 and 2.

It should be noted that the embodiment of FIG. 2 is also applicable to bipolar junction driver transistors, with the region 14 being the base region, and the region 18 being the collector region, region 19 being the emitter region, electrode 17 being the base electrode, electrode 21 being the collector electrode and electrode 22 being the emitter electrode. However, in a bipolar transistor, the base region has the same conductivity type as the substrate while the collector and emitter regions have opposite conductivity type as the substrate. Therefore, the description of the gate region of the JFET is applicable to the collector/emitter regions of the bipolar junction transistor, and the description of the source and drain regions of the JFET, as described above is applicable to the base region of the bipolar junction transistor. Therefore the embodiment of FIG. 2, can be represented by the pixel circuits of FIG. 8.

Referring to FIG. 3, the driver device, i.e., the n-channel JFET 100b, is connected to the anode of the OLED pixel 200. In some embodiments, bottom emission OLEDs may be employed, but direct programming of the circuit may not be possible with this embodiment. In some embodiments, the current to the OLED ($I_{OLED}$) may be calculated in accordance with the following equation:

$$I_{OLED} \approx I_{SS}(1-(V_{data}-V_{OLED})/|V_p|)^2 \quad (2)$$

where $I_{SS}$ is the drain saturation current of the JFET, $V_{OLED}$ is the voltage drop across the OLED, $V_{data}$ is the data line voltage, and $V_p$ is the pinch off voltage of the N-channel JFET 100b. In one example, $V_{OLED}$ may be expressed as $V_{OLED} \approx V_{ON} + nV_T \ln(I_{OLED}/I_0)$, where $I_0$ is the reverse saturation current of the OLED, $V_{ON}$ is the turn-on voltage of the OLED, n is the ideality factor of the OLED and $V_T$ is the thermal voltage (~25.9 mV at room temperature).

Figure 4:
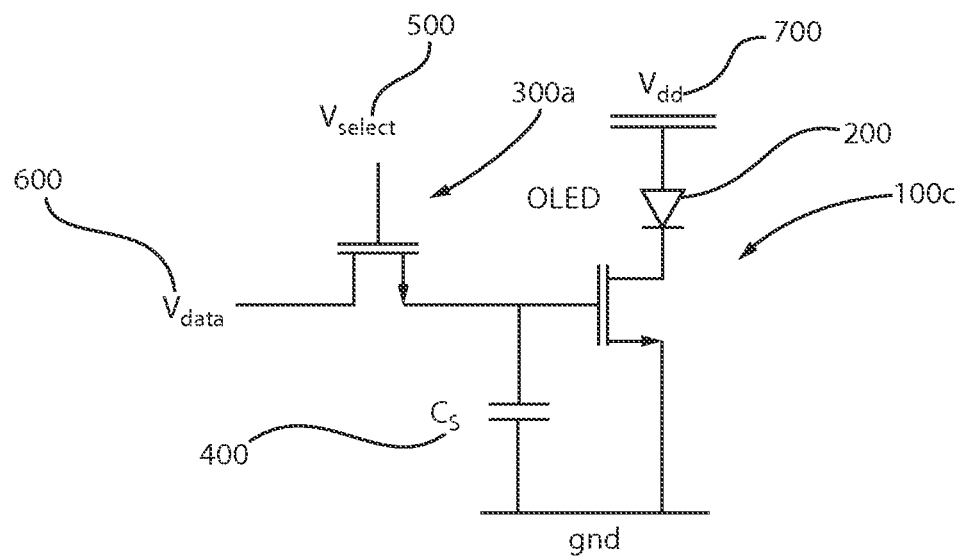
FIG. 4 is a schematic of a pixel circuit for an active matrix organic light emitting diode (AMOLED) including an n-channel JFET or n-channel MOSFET including low temperature deposited contacts providing the driving device of the OLED pixel that is in contact with the cathode of the OLED pixel, and a switching device of a thin film transistor (TFT) including hydrogenated amorphous silicon (a-Si:H), in accordance with one embodiment of the present disclosure.

FIG. 4 depicts a pixel circuit diagram of yet another embodiment of the present disclosure. FIG. 4 depicts a pixel circuit diagram including a switching TFT 300a including hydrogenated amorphous silicon (a-Si:H) and a driver device of an n-channel JFET 100c including crystalline contacts in some embodiments, in which the drain region of the n-channel JFET 100c is in electrical communication with the cathode of an OLED pixel. The n-channel JFET 100c is similar to the n-channel JFET that is 100b that is described above with reference to FIG. 3. The switching TFT 300a including hydrogenated amorphous silicon (a-Si:H) and the pixel capacitor 400 that are depicted in FIG. 4 have been described above with reference to FIGS. 1 and 2.

In some embodiments, the pixel circuit that is depicted in FIG. 4 is suitable for direct programming, but typically a top emission OLED must be employed. In some embodiments, the current to the OLED ($I_{OLED}$) may be calculated in accordance with the following equation:

$$I_{OLED} \approx I_{SS}(1-V_{data}/|V_p|)^2 \quad (3)$$

where $I_{SS}$ is the drain saturation current of the JFET, $V_{data}$ is the data line voltage, and $V_p$ is the pinch off voltage of the N-type JFET 100c.

Figure 5:
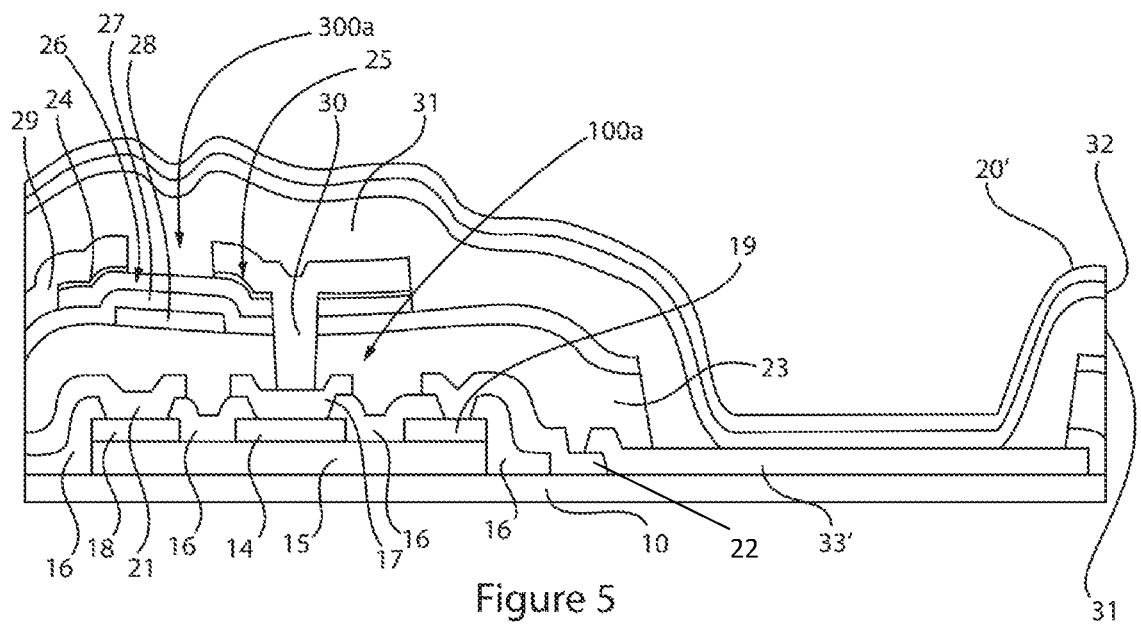
FIG. 5 is a side cross-sectional view depicting a backplane of an active matrix organic light emitting diode (AMOLED), in which the switching thin film transistor (TFT) is a TFT device including hydrogenated amorphous silicon (a-Si:H) having a bottom-gate staggered structure that are present over a JFET or BJT that provides the driving device of the pixel, in which the JFET or BJT is in contact with cathode of the OLED pixel, in accordance with one embodiment of the present disclosure.

FIG. 5 depicts one embodiment, of a backplane of an active matrix organic light emitting diode (AMOLED), in which the bottom-gate staggered switching thin film transistors (TFT) 300a including hydrogenated amorphous silicon (a-Si:H) is present over the JFET 100c that provides the driving device of the pixel, in which the JFET 100c is in contact with cathode electrode 33' of the OLED pixel, as illustrated in the pixel circuit depicted in FIG. 4. In some embodiments, a top-gate staggered switching TFT may be used instead. The backplane of the AMOLED that is depicted in FIG. 5 is similar to the backplane of an active matrix organic light emitting diode (AMOLED) that is depicted in FIG. 2 with the exception that the cathode electrode 33' of the structure depicted in FIG. 5 is in electrical contact with the drain (or source) region contact 19 of the JFET 100c, and the anode electrode 20' is present on the organic material layers 32 of the OLED. Further, the JFET 100c has an n-type channel conductivity, in which the source region contact 18 and the drain region contact 19 have an n-type conductivity and the gate junction 14 has a p-type conductivity. Although not depicted in FIG. 5, the pixel circuit for the AMOLED also includes a pixel capacitor in addition to the switching thin film transistors (TFT) 300a including hydrogenated amorphous silicon (a-Si:H) and the JFET 100c that provides the driving device of the pixel, as depicted in FIG. 4.

Figure 6:
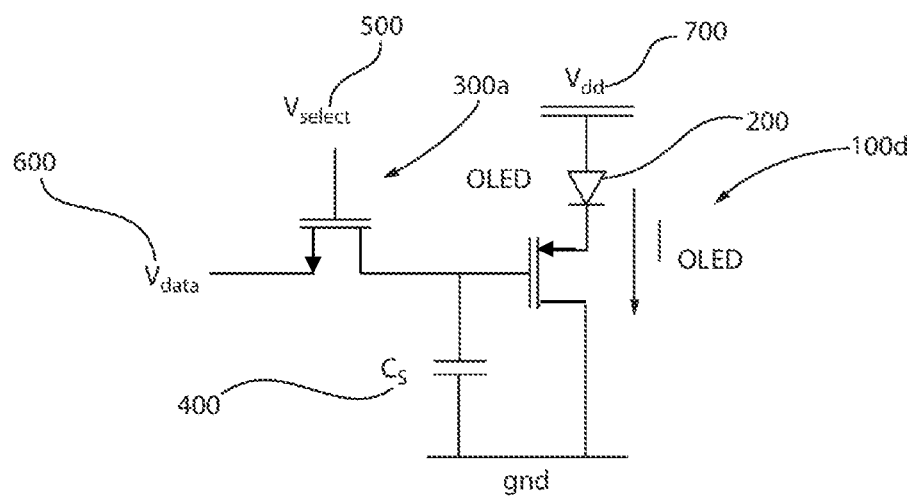
FIG. 6 is a schematic of a pixel circuit for an active matrix organic light emitting diode (AMOLED) including a p-channel JFET or p-channel MOSFET including low temperature deposited contacts providing the driving device of the OLED pixel that is in contact with the cathode of the OLED pixel, and a switching device of a thin film transistor (TFT) including hydrogenated amorphous silicon (a-Si:H), in accordance with one embodiment of the present disclosure.

FIG. 6 depicts a pixel circuit diagram of yet another embodiment of the present disclosure. FIG. 6 depicts a pixel circuit diagram including a switching TFT 300a including hydrogenated amorphous silicon (a-Si:H) and a driver device of a p-type JFET 100d including crystalline contacts, in which the drain region of the p-type JFET 100d is in electrical communication with the cathode of an OLED pixel. The switching TFT 300a including hydrogenated amorphous silicon (a-Si:H), the p-type JFET 100d and the pixel capacitor 400 that are depicted in FIG. 6 have been described above with reference to FIGS. 1 and 2. The p-type JFET 100d depicted in FIG. 6 is in electrical communication with the cathode electrode of the OLED pixel 200, similar to the n-type JFET 100c that is depicted in FIG. 5.

Similar to the embodiment of FIG. 2, the embodiment of FIG. 5 may also represent a driver BJT, with the gate region/electrode of the JFET being the base region/electrode of the BJT, and the drain region/electrode of the JFET being the collector region/electrode of the BJT and the source region/electrode of the JFET being the emitter region/electrode of the BJT; and the conductivity types of the regions being reversed. The embodiment of FIG. 5 may thus be represented by the pixel circuit of FIG. 10, where the collector electrode 22 is connected to the cathode 33' of the OLED.

The OLED pixel depicted in FIG. 6 can be used with top emission OLEDs, in which direct programming may not be possible. In some embodiments, the current to the OLED ($I_{OLED}$) may be calculated in accordance with the following equation:

$$I_{OLED} \approx I_{SS}(1-(V_{dd}-V_{data}-V_{OLED})/|V_p|)^2 \quad (4)$$

where $I_{SS}$ is the drain saturation current of the JFET, $V_{OLED}$ is the voltage of the OLED, $V_{data}$ is the data line voltage, and $V_p$ is the pinch off voltage of the p-type JFET 100d. In one example, $V_{OLED}$ may be expressed as $V_{OLED} \approx V_{ON} + nV_T \ln(I_{OLED}/I_0)$, where $I_0$ is the reverse saturation current of the OLED, $V_{ON}$ is the turn-on voltage of the OLED, n is the ideality factor of the OLED and $V_T$ is the thermal voltage (~25.9 mV at room temperature).

Figure 7:
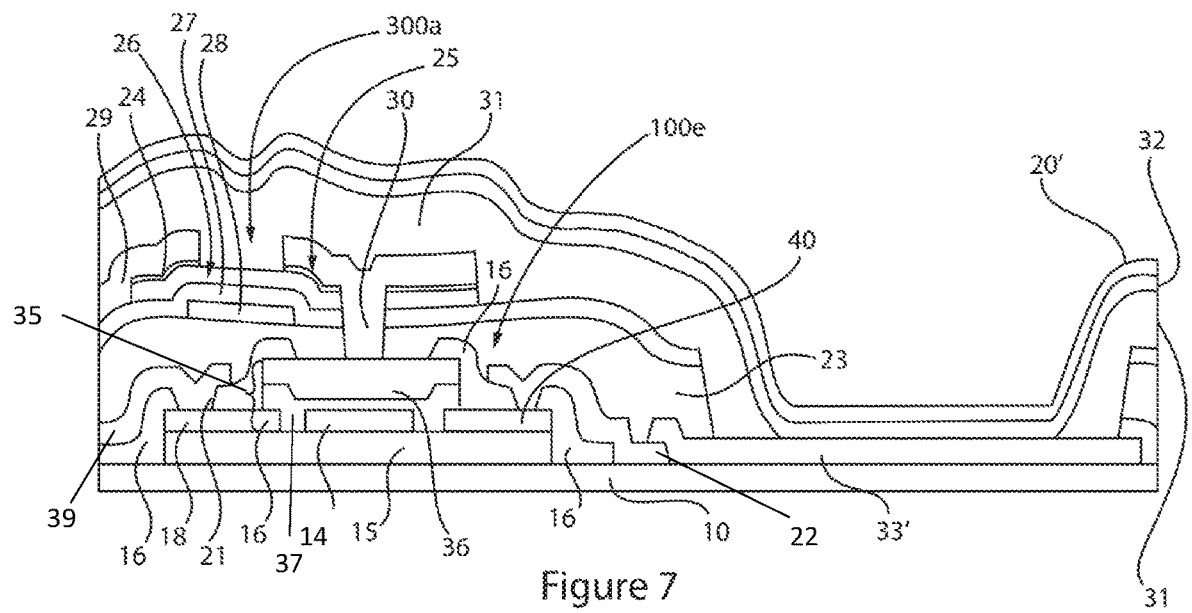
FIG. 7 is a side cross-sectional view depicting a backplane of an active matrix organic light emitting diode (AMOLED), in which the switching thin film transistor (TFT) including hydrogenated amorphous silicon (a-Si:H) having a bottom-gate staggered structure is present over a MOSFET including low temperature formed contacts that provides the driving device of the pixel, in which the MOSFET is in contact with the cathode of the OLED pixel, in accordance with one embodiment of the present disclosure.

Referring to FIG. 7, in some embodiments, a MOSFET driver device 100e may be substituted for the JFET devices 100a, 100b, 100c. 100d circuit diagrams depicted in FIGS. 1-6. In the embodiments, in which the MOSFET driver device 100e is substituted for the JFET devices 100a, 100b, 100c, 100d, the above described Equations (1) through (4) the illustrate operation of the JFET are replaced with equations (1') through (4') for operation of the MOSFET, respectively:

$$I_{OLED} \approx K(V_{dd}-V_{data}-|V_T|)^2 \quad (1')$$

$$I_{OLED} \approx K(V_{data}-V_{OLED}-|V_T|)^2 \quad (2')$$

$$I_{OLED} \approx K(V_{data}-|V_T|)^2 \quad (3')$$

$$I_{OLED} \approx K(V_{dd}-V_{data}-V_{OLED}-|V_T|)^2 \quad (4')$$

where $V_T$ is the threshold voltage of the MOSFET, and $K=0.5 \, \mu C_{ox} W/L$, where $\mu$ is the field-effect mobility, $C_{ox}$ is the gate dielectric capacitance per unit area, W is the channel width and L is the channel length.

In some embodiments, the MOSFET driver device 100e includes crystalline contacts, i.e., source region contact 39 and drain region contact 40, that provides the driver device for the OLED pixel. The MOSFET driver device 100e is similar to a JFET device with the exception that a MOSFET driver device 100e includes an isolated gate structure 35. By isolated gate structure 35 it is meant that the gate electrode 36 is separated from the channel region of the MOSFET driver device 100e by a gate dielectric layer 37. Contrary to a MOSFET device 100e, in a JFET device there is a junction, e.g., a p-n junction formed by direct contact between a first conductivity gate junction portion and a second conductivity channel region portion.

The gate dielectric layer 37 is present on a crystalline semiconductor material 15 that contains the channel region portion of the MOSFET device 100e. The crystalline semiconductor material 15 is present on the insulating substrate 10, and has been described above with reference to FIG. 2. For example, the crystalline semiconductor material 15 may be composed of crystalline silicon, and may have a conductivity that is opposite the conductivity of the source region contact 39 and the drain region contact 40.

The gate dielectric layer 37 of the isolated gate structure 35 of the MOSFET driver device 100d is similar to the gate dielectric 27 of the switching thin film transistors (TFT) 300a that have been described above with reference to FIG. 2. Therefore, the description of the compositions of materials for the gate dielectric 27 of the switching TFT 300a is suitable for the description of the gate dielectric layer 37 of the gate structure 35 that is depicted in FIG. 7. The gate conductor 36 of the isolated gate structure 35 may be composed of metal or a doped semiconductor, such as doped polysilicon.

The source region contact 39 and the drain region contact 40 are composed of crystalline semiconductor material formed on opposing sides of the gate structure 35 on an upper surface of the crystalline semiconductor material 15. The source region contact 39 and the drain region contact 40 of the MOSFET driver device 100e are similar to the source region contact 18 and the drain region contact 19 of the JFET devices 100a, 100c that have been described above with reference to FIGS. 2 and 5. In one example, the source region contact 39 and the drain region contact 40 may be composed of p-type crystalline silicon to provide a p-channel MOSFET 100e for a driver device consistent with the pixel circuit diagrams depicted in FIGS. 1 and 6. In another example, the source region contact 39 and the drain region contact 40 may be composed of n-type crystalline silicon to provide an n-channel MOSFET for a driver device consistent with the pixel circuit diagrams depicted in FIGS. 3 and 4. The drain region contact 40 of the MOSFET driver device 100e may be in electrical communication with the cathode electrode 33 of the OLED pixel, as depicted in FIG. 7, and described with reference to the circuit diagrams depicted in FIGS. 4 and 6. In other embodiments, the drain region contact 40 of the MOSFET driver 100e may be in electrical communication with the anode electrode, as described with reference to the pixel circuit diagrams depicted in FIGS. 1 and 3.

In the pixel circuit diagram depicted in FIG. 1, in which a p-channel MOSFET device is substituted for the p-channel JFET 100a to provide the driver device of the OLED pixel circuit, the MOSFET is connected to the OLED anode 20, and the direct programming of the OLED pixel circuit is possible. The $I_{OLED}$ may be calculated using equation (1').

In the pixel circuit diagram depicted in FIG. 3, in which a n-channel MOSFET device is substituted for the n-channel JFET 100b to provide the driver device of the OLED pixel circuit, the MOSFET device is connected to the OLED anode. In some embodiments, bottom emission OLEDs may be employed with the pixel circuit diagram depicted in FIG. 3, wherein direct programming of the circuit may not be suitable. The $I_{OLED}$ may be calculated using equation (2').

In the pixel circuit diagram depicted in FIG. 4, in which an n-channel MOSFET device is substituted for the n-channel JFET 100c to provide the driver device of the OLED pixel circuit, the MOSFET device is connected to the OLED cathode. In some embodiments, top emission OLEDs may be employed with the pixel circuit diagram depicted in FIG. 4, wherein direct programming of the circuit may be employed. The $I_{OLED}$ may be calculated using equation (3').

In the pixel diagram depicted in FIG. 6, in which a p-channel MOSFET device is substituted for the p-channel JFET 100d to provide the driver device of the OLED pixel circuit, the MOSFET device is connected to the OLED cathode. In some embodiments, top emission OLEDs may be employed with the pixel circuit diagram depicted in FIG. 6, wherein direct programming of the circuit may be employed. The current to the OLED pixel $I_{OLED}$ may be calculated using equation (4').

Figure 8:
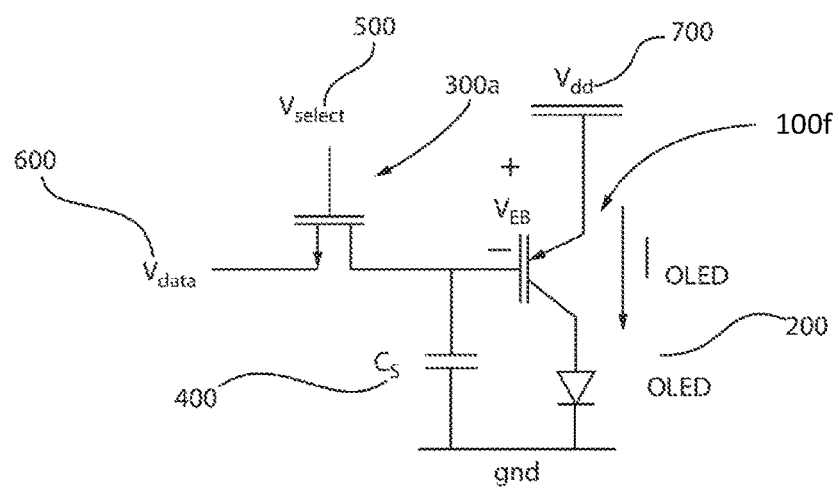
FIG. 8 is a schematic of a pixel circuit for an active matrix organic light emitting diode (AMOLED) including a p-n-p bipolar junction transistor (BJT) providing the driving device of the OLED pixel that is in contact with the anode of the OLED pixel, and a switching device of a thin film transistor (TFT) including hydrogenated amorphous silicon (a-Si:H), in accordance with one embodiment of the present disclosure.
Figure 9:
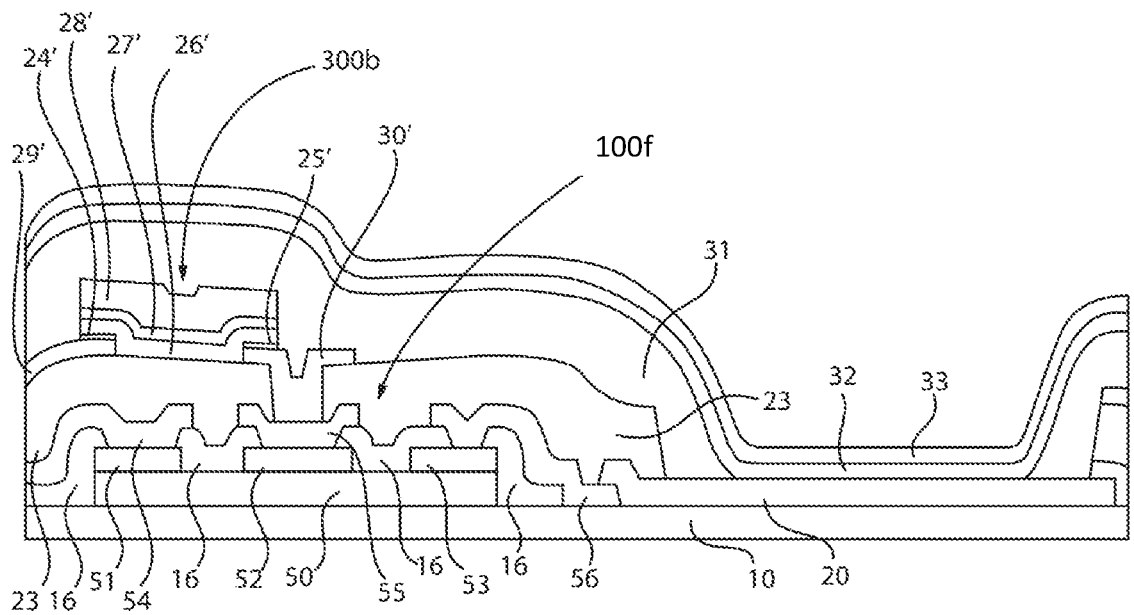
FIG. 9 is a side cross-sectional view depicting a backplane of an active matrix organic light emitting diode (AMOLED), in which the switching thin film transistor (TFT) including hydrogenated amorphous silicon (a-Si:H) having a top-gate staggered structure is present over a junction field-effect transistor (JFET) or bipolar junction transistor (BJT) that provides the driving device of the pixel, in which the JFET or BJT is in contact with anode of the OLED pixel, in accordance with one embodiment of the present disclosure.
Figure 10:
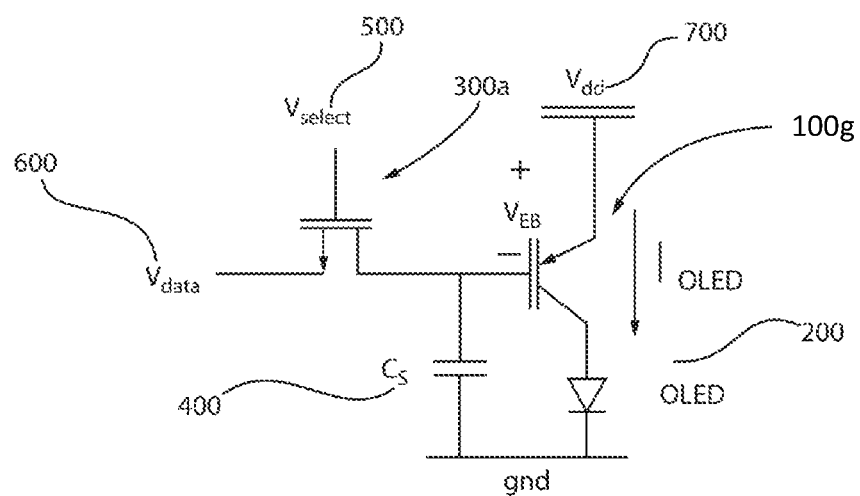
FIG. 10 is a schematic of a pixel circuit for an active matrix organic light emitting diode (AMOLED) including a n-type bipolar junction transistor (BJT) providing the driving device of the OLED pixel that is in contact with the anode of the OLED pixel, and a switching device of a thin film transistor (TFT) including hydrogenated amorphous silicon (a-Si:H), in accordance with one embodiment of the present disclosure.

Referring to FIGS. 8-10, in yet another embodiment of the present disclosure, the driver device may be a bipolar junction transistor including crystalline contacts, e.g., crystalline base, emitter and collector contacts. The term "bipolar junction transistor" denotes a type of transistor made of three regions of semiconductor materials each having an inherent electrical charge, i.e., conductivity, such as n-type or p-type conductivity. Each region has been treated, e.g., doped, so that the layer in the middle (called the base region) has a first conductivity type, while the layers around it, (i.e., the emitter region and the collector region) have a second conductivity type opposite to the first conductivity type. A bipolar junction transistor with an n-type base is designated PNP, and one with a p-type base is designated NPN. When subjected to current flow, the base acts like a gate, enhancing or inhibiting the current flow from the emitter to the collector. The "heterojunction bipolar transistor (HBT)" is a type of bipolar junction transistor (BJT) which uses differing semiconductor base materials, e.g., silicon and germanium, for the emitter and base regions, creating a heterojunction.

FIG. 8 depicts one embodiment of a pixel circuit for an active matrix organic light emitting diode (AMOLED) including a PNP bipolar junction transistor (BJT) 100f providing the driving device of the OLED pixel 200 that is in contact with the anode of the OLED pixel 200, and a switching device of a thin film transistors (TFT) 300a including hydrogenated amorphous silicon (a-Si:H). The pixel circuit includes a PNP bipolar junction transistor (BJT) 100f that is configured to drive an organic light-emitting diode (OLED) by providing current and/or voltage to an electrode, e.g., anode and/or cathode, of the OLED pixel 200. The pixel circuit also includes a pixel capacitor 400. The pixel circuit depicts the circuit to a single pixel in an array of pixels that are distributed in rows and columns. A row select line 500 ($V_{select}$) and a column data line 600 ($V_{data}$) are interconnect with the plurality of pixel circuits. The switching device of a thin film transistors (TFT) 300a including hydrogenated amorphous silicon (a-Si:H) and the pixel capacitor 400 have been described above with reference to FIGS. 1-7. Referring to FIG. 8, in one embodiment, the gate structure of the thin film transistors (TFT) 300a that is composed of hydrogenated amorphous silicon (a-Si:H), which provides the switching device, is coupled to a row select line 500 ($V_{data}$). The source (or drain) region of the thin film transistors (TFT) 300a including hydrogenated amorphous silicon (a-Si:H) that provides the switching device is coupled to a column data line 600 ($V_{data}$), which provides data signals to the thin film transistors (TFT) 300a including hydrogenated amorphous silicon (a-Si:H) that provides the switching device.

In operation, the row select line 500 provides a signal to switch on the thin film transistors (TFT) 300a including hydrogenated amorphous silicon (a-Si:H) once during each refresh period of the display. Accordingly, each row is selected for a period equal to the refresh period divided by the number of rows. The column data line 600 ($V_{data}$) provides column data to the source of thin film transistors (TFT) 300a including hydrogenated amorphous silicon (a-Si:H) in the selected row. The switching TFT 300a transfers the column data (Vdata) to the drain (or source) of switching TFT 300 which is connected to the gate of the driver BJT 100f. The column data (Vdata) is stored on the storage capacitor 400 until the next time the pixel is refreshed, i.e. during the entire frame period. The low off-current (i.e. source-drain leakage) of the switching TFT 300a assures a small discharge of the storage capacitor 400 and therefore a small change in the column data (Vdata) stored on the storage capacitor over the frame period (i.e. until the next refresh). As may be appreciated, in some embodiments, the data on each column data line 600 ($V_{data}$) is different between rows for every row selection to provide a corresponding data value to the thin film transistors (TFT) 300a including hydrogenated amorphous silicon (a-Si:H) that provides the switching device in the selected row.

Referring to FIG. 8, for the purpose of illustration, the source electrode of the switching TFT 300a is connected to Vdata and the drain electrode of the switching TFT is illustrated as connected to the base of the driver BJT 100f. As known in the art, and by convention, in a n-channel TFT, the denotation of drain and source electrodes is interchangeable depending on the direction of the bias, with the drain electrode having a larger voltage compared to the source electrode. Therefore, if at any point of time, the Vdata is smaller than the voltage on the storage capacitance, the electrode connected to Vdata is the source and the electrode connected to the storage capacitor is the drain. In contrast, if at any point in time, Vdata is larger than the voltage on the storage capacitor, the electrode connected to Vdata is the drain and the electrode connected to the storage capacitor is the source.

In order to provide a drive current to the OLED, the pixel circuit requires a driver device, e.g., PNP bipolar junction transistor (BJT) 100f, including low temperature crystalline contacts, in addition to the switching device, i.e., the thin film transistors (TFT) 300a including hydrogenated amorphous silicon (a-Si:H), and an appropriate storage capacitor, i.e., pixel capacitor 400. Specifically, when the select voltage ($V_{select}$) is high, the switching device, i.e., the thin film transistors (TFT) 300a including hydrogenated amorphous silicon (a-Si:H), is on and data voltage ($V_{data}$) from the column data line 600 connected to the source (or drain) region of the switching device passes through the switching device and is written onto (stored in) the storage capacitor 400, until the voltage applied to the base region of the PNP bipolar junction transistor (BJT) 100f substantially equals (or becomes very close to) the data line voltage ($V_{data}$). Then, the driver device, i.e., PNP bipolar junction transistor (BJT) 100f, allows corresponding current ($I_{OLED}$) to flow from the source line ($V_{DD}$) 700 through the driver device, i.e., PNP bipolar junction transistor (BJT) 100f, to the common cathode (Ground) of pixel OLED 200.

The OLED pixel 200 will then emit light, e.g., OLED is turned on. The current level to the OLED pixel 200 is controlled by the base current of the driver device, i.e., PNP bipolar junction transistor (BJT) 100f, and the current source is programmed by setting the base current of driver device, i.e., PNP bipolar junction transistor (BJT) 100f. This is achieved during a short addressing time of about 65 microseconds in some embodiments when the switching device, i.e., the thin film transistors (TFT) 300a including hydrogenated amorphous silicon (a-Si:H), is turned on. When the select voltage ($V_{data}$) is low, the switching device, i.e., thin film transistors (TFT) 300a including hydrogenated amorphous silicon (a-Si:H), is OFF and the stored (programmed) voltage, i.e., charge stored in the pixel capacitor 400, will determine the amount of current flow through the OLED pixel 200. Therefore, if there is negligible change in the stored or programmed voltage, as assured by the low off-current of the switching TFT 300a, substantially the same amount of current should flow from the power or source line ($V_{data}$) through the driver device, e.g., PNP bipolar junction transistor (BJT) 100f, to the pixel OLED 200 (cathode or ground), producing a continuous pixel light emission with a negligible change in brightness over the frame time, (i.e. until next pixel refresh).

The pixel circuit that is depicted in FIG. 8 includes a driver device of PNP bipolar junction transistor (BJT) 100f with contacts to the emitter, base and collector regions using a low temperature deposition process, and a switching device of an n-type thin film transistors (TFT) 300a including at least one layer of hydrogenated amorphous silicon (a-Si:H). For optimum performance of the pixel circuit, the switching device 300 typically has a very low off-current of a-Si:H TFTs (in spite of low TFT mobility) to avoid the discharge of the storage capacitor over the frame (refresh) time of the pixel, and the PNP bipolar junction transistor (BJT) 100f, i.e., driver device, has a high drive current. For example, the low off-current provided by an n-channel α-Si:H TFT switching device in an AMOLED display may range from 10 fA/μm to 1 μA/μm. For example, the high drive current typically provided by the PNP bipolar junction transistor (BJT) 100f driver device in an AMOLED display may range from 10 nA/μm to 1 μA/μm.

In FIG. 8, the driver device, i.e., the PNP bipolar junction transistor (BJT) 100f, is connected to the anode of the OLED pixel 200. The current flowing through the OLED pixel ($I_{OLED}$) is equal to:

$$I_{OLED} \approx (V_{dd} - V_{EB} - V_{data})/(R_E + R_B/\beta) \quad (5)$$

where $I_{OLED}$ is the current passed through the OLED, $V_{dd}$ is the power supply voltage, $V_{EB}$ is the emitter-base voltage of the BJT (i.e. the ON voltage of the emitter-base junction, which is close to 0.7V in silicon), $V_{data}$ is the data line voltage, $R_E$ is the emitter resistance, $R_B$ is the base resistance and β is the current gain of the BJT.

FIG. 9 depicts one embodiment of a backplane of an active matrix organic light emitting diode (AMOLED), in which a switching thin film transistors (TFT) 300b composed of hydrogenated amorphous silicon (a-Si:H) is present over a bipolar junction transistor (BJT) 100f that provides the driving device of the pixel. In this embodiment, the TFT 300b has a top-gate staggered structure. Top-gate refers to a structure where the gate is positioned on top of the channel. Staggered refers to a structure wherein the source and drain contacts are positioned on a side of the channel opposite to the side where the gate is positioned, i.e. in a top-gate staggered structure, the gate is disposed on the top side of the channel, while the source and drain are disposed on the bottom. In some embodiments, a bottom-gate staggered TFT structure may be used instead. In the embodiment that is depicted in FIG. 9, the bipolar junction transistor (BJT) 100f is in contact with the anode 20 of the OLED pixel. The insulating substrate 10 and the anode 20 that are depicted in FIG. 9 have been described above with reference to FIG. 2. In some embodiments, the bipolar junction transistor 100f includes a crystalline substrate 50, a doped hydrogenated crystalline emitter contact 51, a doped hydrogenated crystalline base contact 52, and a doped hydrogenated crystalline collector contact 53. In these embodiments, one or more of the said base, collector and emitter junctions may further include a non-crystalline hydrogenated semiconductor material which is either undoped or doped to the same conductivity type as that of the doped hydrogenated crystalline semiconductor, and disposed between the doped hydrogenated crystalline semiconductor and the gate electrode. If employed, in some embodiments, the non-crystalline hydrogenated material improves the surface passivation of the doped hydrogenated crystalline material and reduces the reverse saturation current of the junction. In some other embodiments, the one or more of the said base, collector and emitter junctions is comprised of a hydrogenated non-crystalline doped semiconductor. In these embodiments, the junction may further include an undoped non-crystalline semiconductor material disposed between the doped non-crystalline hydrogenated semiconductor material and the substrate. If employed, in some embodiments, the non-crystalline undoped hydrogenated material improves the surface passivation of the crystalline substrate and reduces the reverse saturation current of the said junction. The crystalline substrate 50 is similar to the crystalline semiconductor material 15 that is described above with reference to FIG. 2. Therefore, the description of the crystalline semiconductor material 15 is suitable for the crystalline substrate 50. For example, the crystalline substrate 50 may be comprised of crystalline silicon having a p-type conductivity, in which the concentration of the dopant that provides the p-type conductivity may be in the range of $10^{15}$ atoms/cm$^3$ to $10^{19}$ atoms/cm$^3$, in some embodiments. The thickness of the crystalline substrate 50 may range from 15 nm to 2 μm, although thinner or thicker substrates may be used as well.

In some embodiments, the hydrogenated base contact 52 has a same conductivity type as the crystalline substrate 50. For example, when the crystalline substrate 50 has a p-type conductivity, the base contact 52 will also have a p-type conductivity, and when the crystalline substrate 50 has an n-type conductivity, the hydrogenated base contact 52 will also have an n-type conductivity. The dopant concentration of the hydrogenated base contact 52 is typically greater than the dopant concentration in the crystalline substrate 50.

The crystalline base contact 52 is similar in composition to the gate junction 14 of the JFET 100a that is depicted in FIG. 2. For example, the base contact 52 may be composed of a doped hydrogenated crystalline semiconductor material. In some embodiments, the doped hydrogenated crystalline semiconductor material of the base contact 52 may comprise a same or different semiconductor material as that of the crystalline substrate 50. In one example, the doped hydrogenated crystalline semiconductor material of the base contact 52 has the same (or nearly the same) crystalline characteristics as the crystalline substrate 50. Thus, the crystalline base contact 52 has an epitaxial relationship with the crystalline substrate 50.

In one embodiment, the doped hydrogenated crystalline semiconductor material of the base contact 52 is composed of silicon, such as single crystal silicon. In another embodiment, the doped hydrogenated crystalline semiconductor material layer of the base contact 52 has a formula $Si_xGe_{1-x}$ wherein x is $0 \leq x \leq 1$. As such, the doped hydrogenated crystalline semiconductor material of the crystalline base contact 52 may comprise Si (when x is 1), Ge (when x is 0), or a SiGe (when x is other than 1, or 0). Further details on the composition of the crystalline base contact 52 are found above for the description of the gate junction 14 that is described above with reference to FIG. 2.

In one embodiment, the dopant, i.e., p-type or n-type dopant, that dictates the conductivity type of the base contact 52 may have a concentration ranging from $10^{16}$ atoms/cm$^3$ to $10^{12}$ atoms/cm$^3$. The thickness of the crystalline base contact 52 may range from 2 nm to 100 nm, and in some embodiments ranges from 5 nm to 15 nm.

The emitter contact 51 and the collector contact 53 are present on opposing ends of the crystalline substrate 50, in which the base contact 52 is positioned between the emitter contact and the collector contact 53. The emitter contact 51 and the collector contact 53 have an opposite conductivity type as the crystalline substrate 50. For example, when the crystalline substrate 50 has a p-type conductivity, the emitter contact 51 and the collector contact 53 have an n-type conductivity, and when the crystalline substrate 50 has an n-type conductivity, the emitter contact 51 and the collector contact 53 have a p-type conductivity. The emitter and collector contacts 51 and 53 are similar in composition to the gate region 14 of the JFET 100a that is depicted in FIG. 2.

For example, the emitter contact 51 and the collector contact 53 may be composed of a doped hydrogenated crystalline semiconductor material. In some embodiments, the doped hydrogenated crystalline semiconductor material of the crystalline emitter contact 51 and the crystalline collector contact 53 may comprise a same or different semiconductor material as that of the crystalline substrate 50. In one embodiment, the doped hydrogenated crystalline semiconductor material of the emitter contact 51 and the crystalline collector contact 53 is composed of silicon, such as single crystal silicon. In another embodiment, the doped hydrogenated crystalline semiconductor material layer of the emitter contact 51 and the collector contact 53 has a formula $Si_xGe_{1-x}$ wherein x is $0 \leq x \leq 1$. Further details on the composition of the emitter and collector contacts 51 and 53 are found above for the description of the gate contact 14 that is described above with reference to FIG. 2.

In one embodiment, the dopant, i.e., p-type or n-type dopant, that dictates the conductivity type of the emitter contact 51 and the collector contact 53 may have a concentration ranging from $10^{16}$ atoms/cm$^3$ to $10^{21}$ atoms/cm$^3$. The thickness for each of the emitter contact 51 or the collector contact 53 may range from 2 nm to 100 nm, and in some embodiments ranges from 5 nm to 15 nm.

Referring to FIG. 9, a first passivation layer 16 separates the base contact 52 from the crystalline emitter contact 51 and the collector contact 53. The first passivation layer 16 depicted in FIG. 9 is similar to the first passivation layer 16 that is depicted in FIG. 2. Therefore, the description of the first passivation layer 16 that is depicted in FIG. 2 is suitable for the description of the first passivation layer 16 that is depicted in FIG. 9. Openings are present through the first passivation layer 16 to provide an exposed portion of the emitter contact 51, the base contact 52, and the collector contact 53 to be contacted by electrodes. The collector contact electrode 56 extends from the collector contact 53 over the first passivation layer 16 to the anode electrode 20 of the pixel. The emitter contact electrode 54, the base contact electrode 55, and the collector contact electrode 56 may be composed of a similar conductive material as the driver source electrode 21 and the driver drain electrode 22 that are described above with reference to FIG. 2.

A second passivation layer 23 is present over the BJT 100f that provides the driver device for the AMOLED pixel. The second passivation layer 23 that is depicted in FIG. 9 is similar to the second passivation layer 23 that is depicted in FIG. 2. Therefore, the description of the second passivation layer 23 that is depicted in FIG. 2 is suitable for the description of the second passivation layer 23 that is depicted in FIG. 9.

In some embodiments, the switching thin film transistor (TFT) 300b including hydrogenated amorphous silicon (a-Si:H) is present on the second passivation layer 23 overlying at least a portion of the BJT 100f that provides the driver device for the AMOLED pixel. The switching TFT 300b that is depicted in FIG. 9 is a top gate staggered switching thin film transistor 300b. It is noted that the top gate switching TFT 300b that is depicted in FIG. 9 is only one embodiment of a switching TFT including hydrogenated amorphous silicon (a-Si:H) that may be used in combination with a BJT 100f as the driver device for an OLED pixel. Other TFT orientations are also suitable for use with the BJT 100f driver device, such as a bottom gate thin film transistor 300a, as depicted in FIG. 2.

In the top gate switching thin film transistor (TFT) 300b that is depicted in FIG. 9, the channel region portion 26' of the TFT is in direct contact with the upper surface of the second passivation layer 23. The channel region portion 26' of the top gate switching transistor 300b is present between the second passivation layer 23 and the gate dielectric 27'. Further, the top gate switching transistor 300b also includes a gate conductor 28' that is present on the gate dielectric 27', wherein the gate conductor 28' is separated from the second passivation layer 23 by the gate dielectric 27' and the channel region portion 26'. The gate conductor 28', the gate dielectric 27', and the channel region portion 26' of the top gate switching TFT 300b that is depicted in FIG. 9 is similar to the gate conductor 28, the gate dielectric 27, and the channel region portion 26 of the bottom gate switching TFT 300a that is depicted in FIG. 2. Therefore, the description of the compositions for the materials of the gate conductor 28, the gate dielectric 27, and the channel region portion 26 that are depicted in FIG. 2 are suitable for the gate conductor 28', the gate dielectric 27', and the channel region portion 26' of the top gate switching TFT 300b that is depicted in FIG. 9. For example, the channel region portion 26' may be composed of intrinsic amorphous hydrogenated silicon (α-Si:H).

Still referring to FIG. 9, the top gate switching TFT 300b may also include a source region 24' and a drain region 25' of a hydrogenated amorphous semiconductor material. The source region 24' and the drain region 25' that are depicted in FIG. 9 are similar to the source region 24 and the drain region 25 of the bottom gate switching TFT 300a that is depicted in FIG. 2. Therefore, the above description of the composition of the source region 24 and the drain region 25 of the bottom gate switching TFT 300a that is depicted in FIG. 2 is suitable for the description of the composition of the source region 24' and the drain region 25' that are depicted in FIG. 9. For example, the source region 24' and the drain region 25' that are depicted in FIG. 9 may be hydrogenated amorphous silicon (α-Si:H) that is doped to an n-type conductivity. The source region 24' is in direct contact with a first end of the channel region portion 26' and is separated from the second passivation layer 23 by the switching source electrode 29'. The drain region 25' is in direct contact with a second end of the channel region portion 26' and is separated from the second passivation layer 23 by the switching drain electrode 30'. The description of the switching source electrode 29 and the switching drain electrode 30 that are depicted in FIG. 2 are suitable for the description of the switching source electrode 29' and the switching drain electrode 30' that are depicted in FIG. 9.

A third passivation layer 31 is present over the switching thin film transistor (TFT) 300b. The description of the third passivation layer 31 that is depicted in FIG. 2 is suitable for describing the third passivation layer that is depicted in FIG. 9. The third passivation layer 31 does not cover the entirety of the anode electrode 20 of the OLED pixel.

Still referring to FIG. 9, organic material layers 32 of the organic light emitting diode (OLED) are present over the third passivation layer 31 and are in direct contact with the anode electrode 20. The description of the organic material layers 32 depicted in FIG. 2 is suitable for the description of the organic material layers 32 that are depicted in FIG. 9. Further, a cathode electrode 33 is present on the organic material layers 32. The cathode electrode 33 has been described above with reference to FIG. 2.

FIG. 10 depicts the circuit diagram of another embodiment of the present disclosure including a driver device of an NPN bipolar junction transistor 100g with hydrogenated contacts to the emitter, base and collector regions of the device, and a switching device of an n-channel thin film transistors (TFT) 300a including at least one layer of hydrogenated amorphous silicon (a-Si:H). In FIG. 10, the driver device, i.e., the collector of the NPN bipolar junction transistor (BJT) 100f, is connected to the cathode of the OLED pixel 200. The current flowing through the OLED pixel ($I_{OLED}$) is equal to:

$$I_{OLED} \approx (V_{data} - V_{BE})/(R_E + R_B/\beta) \quad (5)$$

where $I_{OLED}$ is the current passed through the OLED, $V_{dd}$ is the power supply voltage, $V_{BE}$ is to the base-emitter voltage of the BJT (i.e. the ON voltage of the base-emitter junction which is close to 0.7V in silicon), $V_{data}$ is the data line voltage, $R_E$ is the emitter resistance, $R_B$ is the base resistance and p is the current gain of the BJT. The NPN bipolar junction transistor 100f depicted in FIG. 10 is similar to the PNP bipolar junction transistor 100f that is described above with reference to FIGS. 8 and 9, with the exception that the emitter contact, the base contact, and the collector contact of the NPN bipolar junction transistor 100f depicted in FIG. 10 have opposite conductivities as the corresponding emitter contact 51, the base contact 52, and the collector contact 53 of the PNP bipolar junction transistor 100f that is depicted in FIG. 9. Further, the collector contact of the NPN bipolar junction transistor employed in the AMOLED pixel that is depicted in FIG. 10 is in contact with the cathode of the OLED, as opposed to being in contact with the anode of the OLED.

In another aspect of the present disclosure, a method of forming an AMOLED pixel circuit has been provided that includes a switching device of a thin film transistor (TFT) including amorphous hydrogenated silicon and a driver device comprised of a crystalline channel, such as a JFET (as depicted in FIGS. 2 and 5), MOSFET (as depicted in FIG. 7) or a BJT device (as depicted in FIG. 9). Some embodiments of a method of forming an AMOLED pixel are now discussed with reference to FIGS. 11-14. Referring to FIG. 1, in some embodiments, the method may begin at step 55 with patterning the semiconductor layer on a semiconductor-on-insulator (SOI) substrate to form the active regions of a driver device, and forming the contact regions of the driver device by depositing and patterning hydrogenated silicon containing materials on the crystalline substrate using a low temperature deposition process. The starting SOI substrate may be formed using various layer-transfer techniques known in the art, including but not limited to smart cut, epitaxial layer lift-off and controlled spalling, followed by various bonding methods known in the art including but not limited to thermal bonding, plasma-assisted bonding and adhesive bonding. As known in the art, a layer-transfer technique is used to transfer a thin layer of the semiconductor from a host substrate, followed by bonding onto an insulating carrier substrate to form a SOI substrate. The hydrogenated silicon containing material that may be used for forming contact regions on the crystalline SOI substrate may be crystalline, non-crystalline or combinations thereof. The hydrogenated crystalline material may be formed using a low temperature epitaxial deposition process. "Epitaxial growth and/or deposition" means the growth of a semiconductor material on a deposition surface of a semiconductor material, in which the semiconductor material being grown has the same (or nearly the same) crystalline characteristics as the semiconductor material of the deposition surface. In accordance with the present disclosure, the hydrogenated crystalline material forming the contact regions of the driver device may be epitaxially grown at a temperature of less than 500° C. using a gas mixture that includes a source gas, hydrogen and a dopant gas. In some embodiments, the hydrogenated crystalline material of the crystalline driver device can be epitaxially grown at a temperature from 150° C. to 300° C. In other embodiments, the crystalline material of the driver device can be epitaxially grown at a temperature from 150° C. to 250° C. The temperatures disclosed herein for the epitaxial growth is at the surface of the substrate in which the epitaxial semiconductor material layer is formed.

Figure 11:
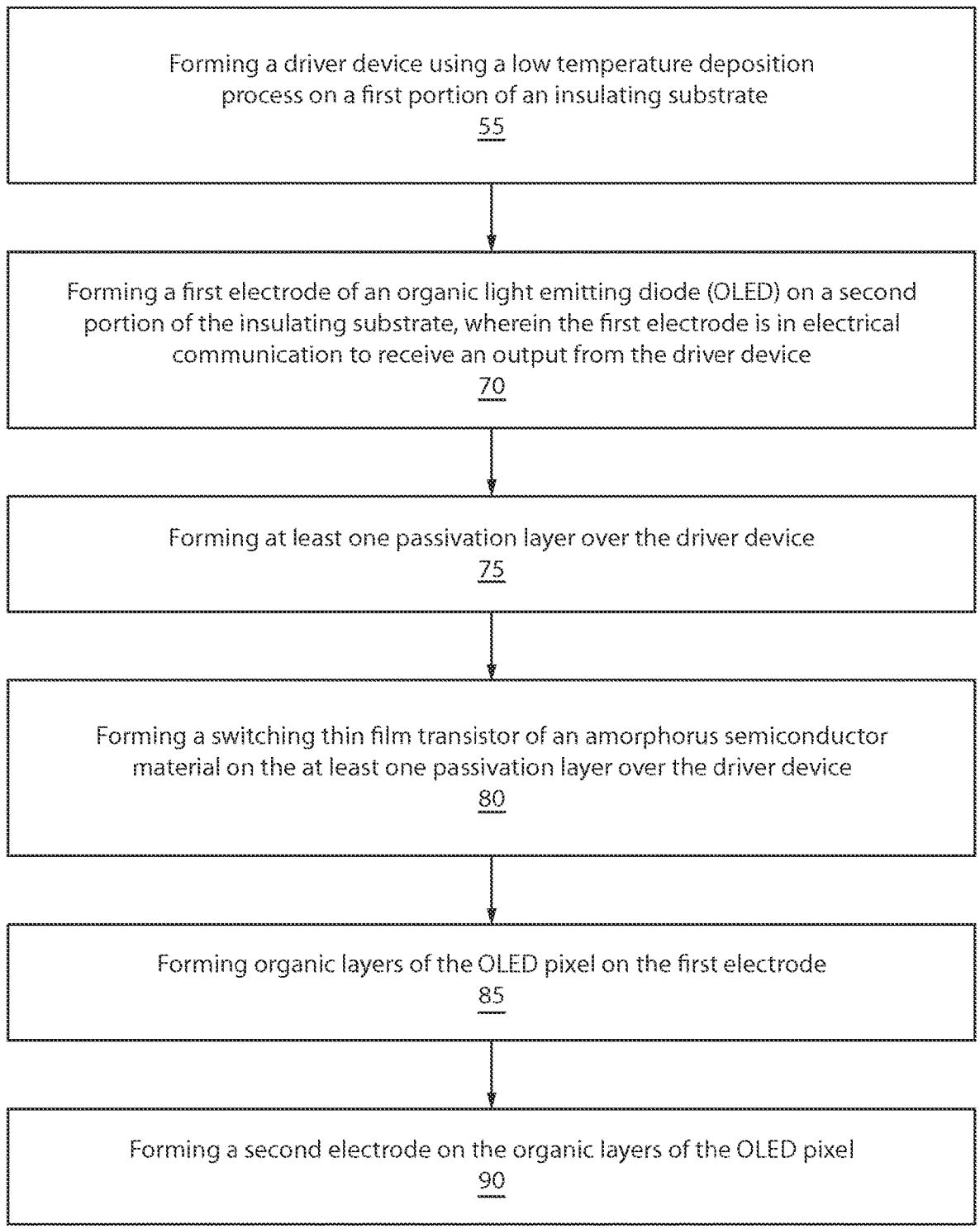
FIG. 11 is a flow chart describing one embodiment of a method of forming an active matrix pixel that includes forming a driver device including crystalline semiconductor, in accordance with one embodiment of the present disclosure.
Figure 12:
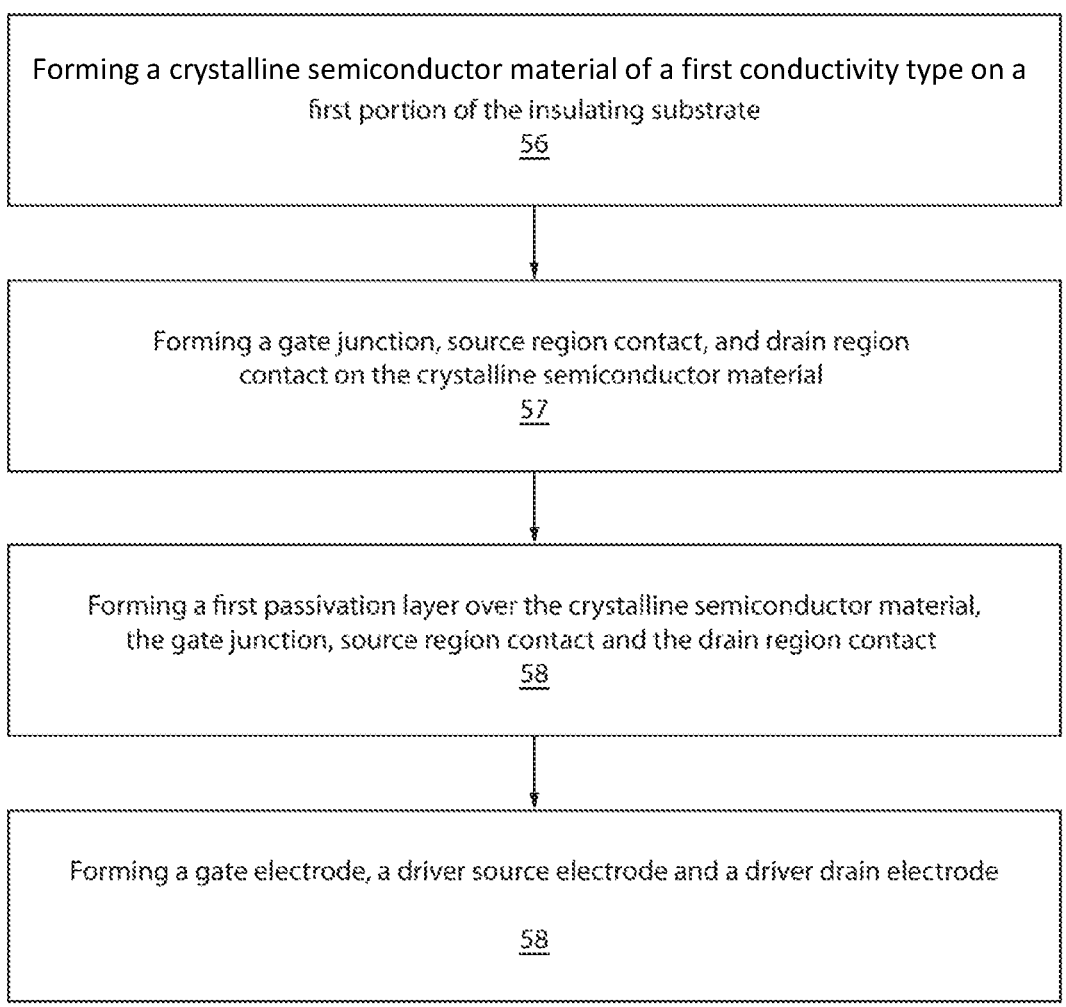
FIG. 12 is a flow chart describing one embodiment of a method of forming an active matrix pixel in accordance with the process flow described in FIG. 11, wherein the driver device is a JFET.

In some embodiments, the crystalline driver device that is referred to in step 55 of the process flow depicted in FIG. 11 may be a JFET 100a, 100b, 100c, 100d, as described above with reference to FIGS. 1-6. One method of forming a JFET is described with reference to the flow chart depicted in FIG. 12. Referring to FIG. 12, in one embodiment, a JFET 100a, 100b, 100c, 100d may be formed by a method beginning with step 56 of forming a crystalline semiconductor material 15 of a first conductivity type on a first portion of the insulating substrate 10, as depicted in FIG. 2. The crystalline semiconductor material 15 may be positioned on the insulating substrate 10 using layer transfer and bonding methods, or may be formed using a deposition method which may involve post deposition crystallization as known in the art.

In one example, a non-crystalline layer is deposited on an insulating substrate, followed by laser-assisted crystallization to form a poly-crystalline or multi-crystalline layer. For example, the crystalline semiconductor material 15 may be bonded to the insulating substrate following a spalling process, such as controlled spalling. The crystalline semiconductor material 15 may also be formed using a deposition process, such as chemical vapor deposition (CVD), e.g., atmospheric pressure CVD, low pressure CVD, plasma enhanced CVD, metal organic CVD, atomic layer deposition, and combinations thereof. In some embodiments, etch processes may be employed to remove portions of the crystalline semiconductor material 15 that extend beyond the first portion of the insulating substrate 10. The crystalline semiconductor material 15 may be doped using in situ doping, an ion implantation process, plasma doping, gas phase diffusion, or a combination thereof. In embodiments that substrate preparation involves layer transfer (e.g. spalling), the crystalline semiconductor material 15 is preferably doped prior to layer transfer, e.g during the crystal growth of the host substrate.

Following formation of the crystalline semiconductor material 15, the gate junction 14, the source region contact 18 and the drain region contact 19 are formed of a hydrogenated semiconductor on the upper surface of the crystalline semiconductor material 15 using a low temperature deposition process. In some embodiments, a portion or the entire hydrogenated semiconductor is comprised of a hydrogenated crystalline material and is grown epitaxially using the low-temperature deposition process at step 57. In one embodiment of the present disclosure, the low temperature epitaxial deposition process includes plasma enhanced chemical vapor deposition (PECVD). PECVD is a deposition process used to deposit films from a gas state (vapor) to a solid state on a deposition substrate. Chemical reactions are involved in the process, which occur after creation of a plasma of the reacting gases. A plasma is any gas in which a significant percentage of the atoms or molecules are ionized. Fractional ionization in plasmas used for deposition and related materials processing varies from about $10^{-4}$ in capacitive discharge plasmas to as high as 5-10% in high density inductive plasmas. Processing plasmas are typically operated at pressures of a few millitorr to a few torr, although arc discharges and inductive plasmas can be ignited at atmospheric pressure. In some embodiments, the plasma is created by RF (AC) frequency, such as a radio frequency induced glow charge, or DC discharge between two electrodes, the space between which is filled with the reacting gases. In one example, a PECVD device employs a parallel plate chamber configuration. In other embodiments, a hot-wire chemical vapor deposition process can be used in forming the crystalline material for the gate junction 14, the source region contact 18 and the drain region contact 19.

In one embodiment, the source gas used to form the hydrogenated material for the gate junction 14, the source region contact 18 and the drain region contact 19 may comprise a Si-containing precursor, such as, for example a silane and a disilane and/or a germanium-containing precursor such as, for example, a germane, $GeH_4$. In some embodiments, Si-containing and Ge-containing precursors can be used in forming the doped hydrogenated semiconductor material layer. Other gases including a carbon source such, as for example, $CH_4$ may be used.

In one embodiment and to provide epitaxial growth of a doped hydrogenated semiconductor material layer for the crystalline material for the gate junction 14, the source region contact 18 and the drain region contact 19, a gas mixture including a ratio of hydrogen to source gas of from greater than 5:1 can be used. In another embodiment, the ratio of hydrogen to source gas that can be used ranges from 5:1 to 1000:1. For example, epitaxial growth of silicon is possible at temperatures as low as 150° C. with ratios of hydrogen to silane ($SiH_4$) ranging from 5:1 to 20:1. In another embodiment, and to provide the growth of a non-crystalline hydrogenated semiconductor material layer for the gate junction 14, the source region contact 18 and the drain region contact 19, a gas mixture including a ratio of hydrogen to source gas of from smaller than 20:1 can be used. In another embodiment, the ratio of hydrogen to source gas that can be used ranges from 2:1 to 10:1. In another embodiment, the ratio of hydrogen to source gas that can be used ranges from 0:1 to 5:1. For example, growth of non-crystalline hydrogenated silicon is possible at temperatures as low as 150° C. with ratios of hydrogen to silane ($SiH_4$) ranging from 0:1 to 5:1.

The gate junction 14, source region contact 18 and the drain region contact 19 are islands of material that are separated from one another as depicted in FIGS. 2 and 5. To provide the islands of material, block masks can be formed on portions of the crystalline semiconductor material 15 that the islands of material are not to be formed on prior to the low temperature epitaxial deposition process. In other embodiments, a single material layer may be blanked deposited on the crystalline semiconductor material layer 15, which is patterned and etched to provide the gate junction 14, source region contact 18 and the drain region contact 19.

The dopant gas that can be present in the epitaxial growth process of the hydrogenated crystalline material or the non-epitaxial growth of the non-crystalline hydrogenated material provides the conductivity type, either n-type or p-type, to the doped hydrogenated semiconductor material layer for the crystalline material of the gate junction 14, the source region contact 18 and the drain region contact 19. As indicated above, the gate junction 14 has the opposite conductivity type as the crystalline semiconductor material 15, while the source region contact 18 and the drain region contact 19 have the same conductivity type as the crystalline semiconductor material 15. When a doped hydrogenated semiconductor material layer of an n-type conductivity is to be formed, the dopant gas includes at least one n-type dopant, e.g., phosphorus or arsenic. For example, when phosphorus is the n-type dopant, the dopant gas can be phosphine ($PH_3$), and when arsenic is the n-type dopant, the dopant gas can be arsine ($AsH_3$). In one example, when the conductivity type dopant is n-type, the dopant gas include phosphine gas ($PH_3$) present in a ratio to silane ($SiH_4$) ranging from 0.01% to 10%. In another example, when the conductivity type dopant is n-type, the dopant gas include phosphine gas ($PH_3$) present in a ratio to silane ($SiH_4$) ranging from 0.1% to 2%.

When a doped hydrogenated semiconductor material layer of a p-type conductivity is to be formed, a dopant gas including at least one p-type dopant, e.g., boron, is employed. For example, when boron is the p-type dopant, the dopant gas can be diborane ($B_2H_6$). In one embodiment, wherein the conductivity type dopant is p-type, the dopant gas may be diborane ($B_2H_6$) present in a ratio to silane ($SiH_4$) ranging from 0.01% to 10%. In another embodiment, wherein the conductivity type dopant is p-type, the dopant gas may be diborane ($B_2H_6$) present in a ratio to silane ($SiH_4$) ranging from 0.1% to 2%. In yet another embodiment, in which the conductivity type dopant is p-type, the dopant gas for may be trimethylboron (TMB) present in a ratio to silane ($SiH_4$) ranging from 0.1% to 10%.

Block masks may be utilized to provide regions of different conductivity type, as needed for the gate junction 14, the source region contact 18 and the drain region contact 19.

In one embodiment of the present disclosure, the pressure for the PECVD process that can be used for epitaxially growing the doped hydrogenated semiconductor material layer for the gate junction 14, the source region contact 18 and the drain region contact 19 can range from 10 mTorr to 5 Torr, and in one example may be in the range of 250 mTorr to 900 mTorr. The power density for the PECVD process for epitaxially growing the doped hydrogenated semiconductor material layer may range from 1 mW/cm$^2$ to 100 mW/cm$^2$, and in one example may be in the range of 3 mW/cm$^2$ to 10 mW/cm$^2$. Further details regarding the epitaxial growth process for forming the doped hydrogenated semiconductor material layer of the present disclosure are described in U.S. patent application Ser. No. 13/032,866, filed Feb. 23, 2011, (entitled "LOW-TEMPERATURE SELECTIVE EPITAXIAL GROWTH OF SILICON FOR DEVICE INTEGRATION"), which is owned by the assignee of the present disclosure, and is incorporated herein by reference.

At step 58 of the process flow depicted in FIG. 12, a first passivation layer 16 (as depicted in FIGS. 2 and 5) is formed over the crystalline semiconductor material 15, as well as the hydrogenated material of the gate junction 14, the source region contact 18 and the drain region contact 19. The first passivation layer 16 may be formed using chemical vapor deposition (CVD), e.g., atmospheric pressure CVD, low pressure CVD, plasma enhanced CVD, metal organic CVD, atomic layer deposition, and combinations thereof. Other methods that may be used to provide first passivation layer 16 include oxidation, evaporation, spin on deposition and chemical solution deposition. Following deposition of the passivation layer 16, openings may be formed there through to expose an upper surface of the gate region contact 14, the source region contact 18 and the drain region contact 19. The openings may be formed using photolithography and etch processes.

At step 59 of the process flow depicted in FIG. 12, a gate electrode 17, a driver source electrode 21, and a driver drain electrode 22 (as depicted in FIGS. 2 and 5) are formed in the opening to the upper surface of the gate region contact 14, the source region contact 18 and the drain region contact 19. The gate electrode 17, the driver source electrode 21, and the driver drain electrode 22 may be formed using physical vapor deposition, electro-deposition, plating and sputtering. Examples of sputtering process for forming the gate electrode 17, the driver source electrode 21, and the driver drain electrode 22 may include DC diode type systems, radio frequency (RF) sputtering, magnetron sputtering, and ionized metal plasma (IMP) sputtering.

In some embodiments, the crystalline driver device that is referred to in step 55 of the process flow depicted in FIG. 11 may be a MOSFET 100e, as described above with reference to FIG. 7. One method of forming a MOSFET 100e is described with reference to the flow chart depicted in FIG. 13. Beginning at step 60 of the process flow depicted in FIG. 13, in one embodiment, a method of forming a MOSFET 100e may begin with forming a crystalline semiconductor material 15 on a first portion of the insulating substrate 10. The method for forming the crystalline semiconductor material 15 for the MOSFET 100e driver device is similar to the method for forming the crystalline semiconductor material 15 for the JFET 100a, 100b, 100c, 100d that has been described at step 56 of the process flow depicted in FIG. 12. Therefore, the description of step 56 of the process flow depicted in FIG. 12 is suitable for the description of step 60 of the process flow depicted in FIG. 13.

Figure 13:
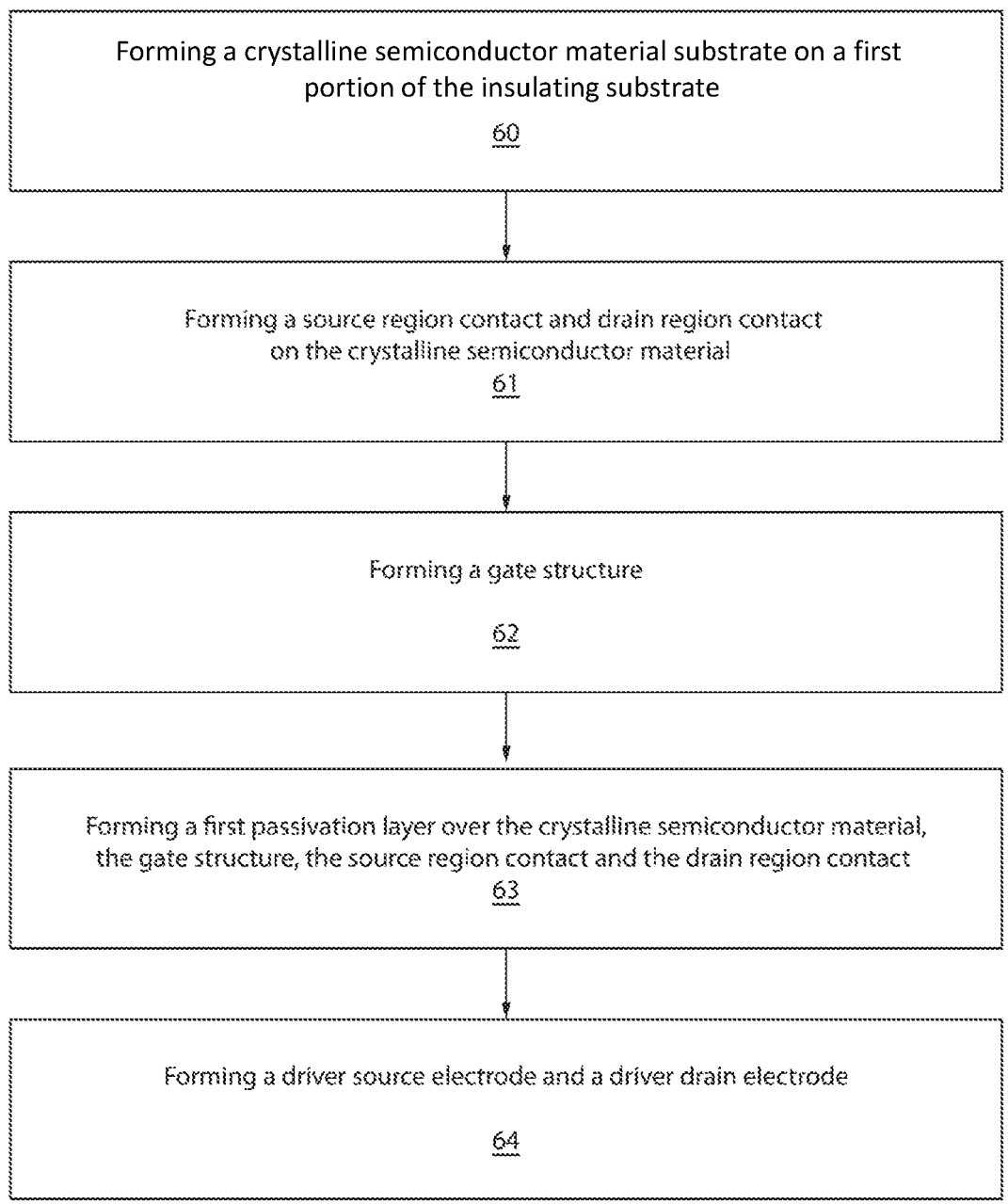
FIG. 13 is a flow chart describing one embodiment of a method of forming an active matrix pixel in accordance with the process flow described in FIG. 11, wherein the driver device is a MOSFET.

The process sequence for forming the MOSFET 100e driver device may continue at step 61 of FIG. 13, wherein a source region contact 39 and a drain region contact 40 (as depicted in FIG. 7) of a crystalline material are formed on opposing sides of the crystalline semiconductor material 15. The source region contact 39 and the drain region contact 40 are formed of a hydrogenated material using a low temperature epitaxial deposition process similar to the low temperature deposition process for forming the gate junction 14, source region contact 18, the drain region contact 19 that is described above for step 57 of the process flow for forming a JFET 100a, 100b, 100c, 100d in FIG. 12. The source region contact 39 and the drain region contact 40 are preferably crystalline and grown epitaxially; however in some embodiments, non-crystalline materials can be used as well. The description of step 57 of the process flow depicted in FIG. 12 is suitable for the description of step 61 of the process flow depicted in FIG. 13. One difference between the JFET driver device 100a, 100b, 100c, 100d and the MOSFET driver device 100e, is that the MOSFET device 100e does not include the gate junction 14 of the JFET 100a, 100b, 100c, 100d. In the MOSFET device 100e the source region contact 39 and the drain region contact 40 are separated from one another on opposing sides of the crystalline semiconductor material 15 and have an opposite conductivity type as the crystalline semiconductor material 15.

At step 62 of the process flow depicted in FIG. 13, a gate structure 35 is formed on a channel portion of the crystalline semiconductor material 15 between the source region contact 39 and the drain region contact 40. The gate structure 35 includes a gate dielectric 37 that is in direct contact with the upper surface of the crystalline semiconductor material 15 between the source region contact 39 and the drain region contact 40, and a gate electrode 36 that is present on the gate dielectric 37. The gate structure 35 may be formed by forming blanket material layers for the at least one gate dielectric 37 and the at least one gate electrode 36 to provide a gate stack, and patterning and etching the gate stack to provide the gate structure 35. The etch process for forming the gate structures 35 may include selective and/or anisotropic etch processes.

Referring to step 63 of the process flow depicted in FIG. 13, the step of forming the first passivation layer 16 over the crystalline semiconductor material 15, the gate structure 35, the source region contact 39 and the drain region contact 40 is similar to the method of forming the first passivation layer 16 that covers the driver device of the JFET 100a, 100b, 100c, 100d, which is described at step 58 of the process flow depicted in FIG. 12. Therefore, the description of step 58 of the process flow depicted in FIG. 12 is suitable for the description of step 63 of the process flow depicted in FIG. 13.

At step 64 of the process flow depicted in FIG. 13, a driver source electrode 21 and a driver drain electrode 22 are formed in contact with the source region contact 39 and the drain region contact 40. The driver source electrode 21 and driver drain electrode 22 may be formed in openings through the first passivation layer 16 using a deposition process similar to the method for forming the gate electrode 17, the driver source electrode 21, and the driver drain electrode 22 of the JFET described in step 59 of FIG. 12. Following deposition of the material layer for the driver source electrode 21 and driver drain electrode 22, an etch process may be used to remove the portion of the material layer for the driver source electrode 21 and driver drain electrode 22 that extends onto the gate structure 35.

In some embodiments, the crystalline driver device that is referred to in step 55 of the process flow depicted in FIG. 11 may be a BJT 100f, as described above with reference to FIG. 9. One method of forming a BJT 100f is described with reference to the flow chart depicted in FIG. 14. Beginning at step 65 of the process flow depicted in FIG. 14, in one embodiment, a method of forming a BJT 100f may begin with forming a crystalline substrate 50 on a first portion of the insulating substrate 10. The crystalline substrate 50 for the BJT 100f depicted in FIG. 9 is similar to the crystalline semiconductor material 15 used in the JFET 100a, 100c depicted in FIGS. 2 and 5. Therefore, the method for forming the crystalline substrate 50 for the BJT 100f driver device is similar to the method for forming the crystalline semiconductor material 15 for the JFET 100a, 100b, 100c, 100d that has been described at step 56 of the process flow depicted in FIG. 12. The description of step 56 of the process flow depicted in FIG. 12 is suitable for the description of step 65 of the process flow depicted in FIG. 14.

Figure 14:
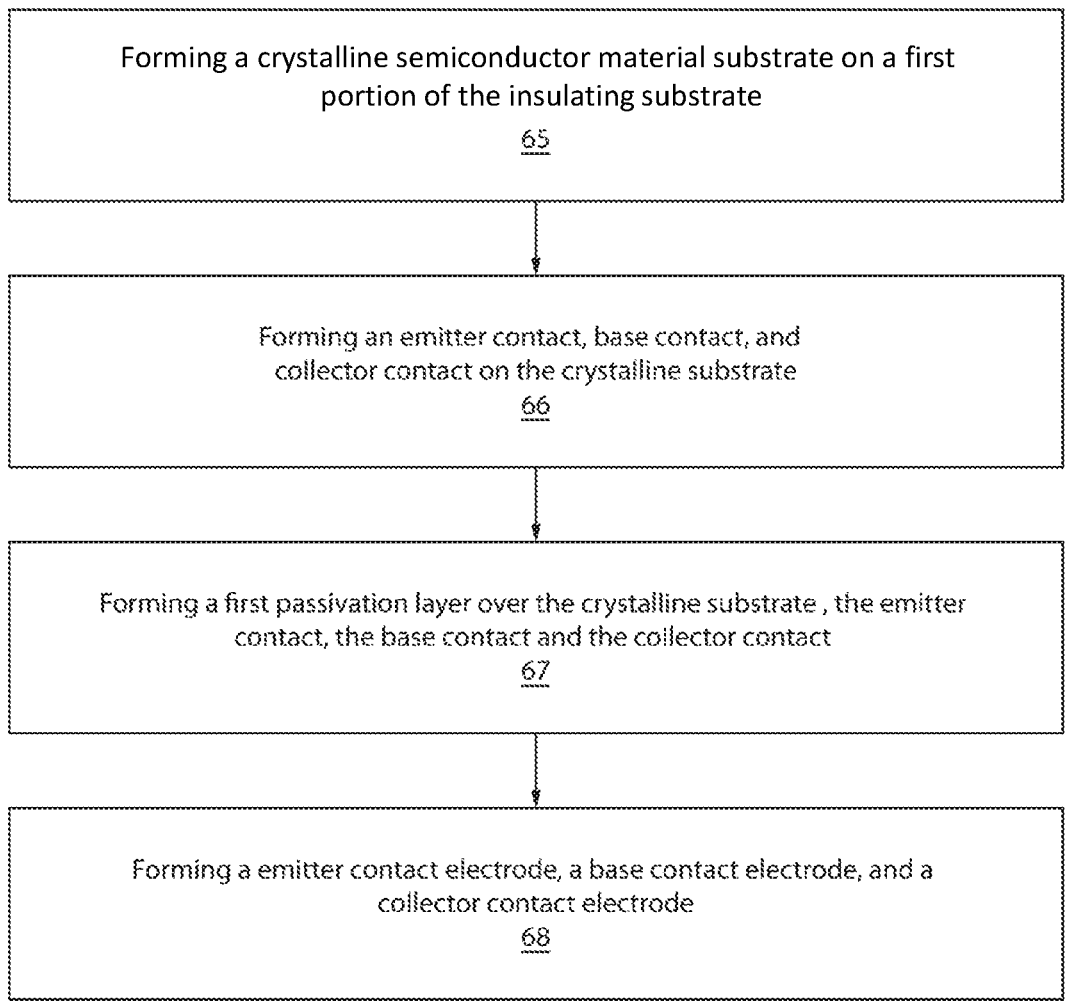
FIG. 14 is a flow chart describing one embodiment of a method of forming an active matrix pixel in accordance with the process flow described in FIG. 11, wherein the driver device is a bipolar junction transistor (BJT).

Referring to step 66 of the process flow depicted in FIG. 14, in a following process step, an emitter contact 51, a base contact 52, and a collector contact 53 is formed to the crystalline semiconductor substrate 50. The emitter contact 51, the base contact 52 and the collector contact 53 are similar in composition and method of manufacture as the gate junction 14 of the JFET 100a, 100c that are depicted in FIGS. 2 and 5. For example, the crystalline emitter contact 51, crystalline base contact 52, and crystalline collector contact 53 are formed using a low temperature deposition process such as PECVD. Therefore, the description of step 57 of the process flow depicted in FIG. 12 for forming the gate junction 14 and the ohmic contact to the source region contact and the drain region contact 19 of the JFET 100a using a low temperature epitaxial deposition process is suitable for the description of step 66 of the process flow depicted in FIG. 14.

Still referring to FIG. 14, following the formation of the emitter contact 51, base contact 52, and collector contact 53, a first passivation layer 16 is formed over the emitter contact 51, base contact 52, and collector contact 53 at step 67. The step of forming the first passivation layer 16 at step 67 of the process flow depicted in FIG. 14 is similar to the method of forming the first passivation layer that covers the driver device of the JFET, which is described at step 58 of the process flow depicted in FIG. 12. Therefore, the description of step 57 of the process flow depicted in FIG. 12 is suitable for the description of step 67 of the process flow depicted in FIG. 14.

At step 68 of the process flow depicted in FIG. 14, an emitter contact electrode 54 is formed to the emitter contact 51, a base contact electrode 55 is formed to the base contact 52, and a collector contact electrode 56 is formed to the emitter contact 53. The method for forming the emitter contact electrode 54, the base contact electrode 55 and the collector contact electrode 56 is similar to the method for forming the gate electrode 17 of the JFET described in step 59 of FIG. 12.

Referring to FIG. 11, following the formation of the driver device, i.e., JFET, MOSFET and/or BJT of crystalline semiconductor material, a first electrode of the OLED is formed on a second portion of the insulating substrate 10 at step 70. In some embodiments, the first electrode may be the anode 20 of the OLED, as depicted in FIGS. 2 and 9, or the first electrode may be the cathode 33' of the OLED, as depicted in FIGS. 5 and 7. The second portion of the insulating substrate 10 that the first electrode is formed on is adjacent to the first portion of the insulating substrate 10, wherein the first and second portion are on the same side of the insulating substrate 10, e.g., upper surface side. The first electrode may be formed using physical vapor deposition (PVD) or chemical vapor deposition (CVD). For example, when the first electrode is composed of indium tin oxide (ITO), the ITO may be deposited at room temperature by DC-sputtering from an $In_2O_3/SnO_2$ target in an $Ar/O_2$ atmosphere. An etch process, such as wet etching, may be used to remove the portions of the material layer deposited for the first electrode that extend into the first portion of the insulating substrate 10. The first electrode is in electrical communication with the driver device to receive an output from the driver device. For example, when the driver device is a JFET 100a, the first electrode (e.g., anode 20) can be in contact with the driver drain electrode 22, as depicted in FIG. 2.

Referring to FIG. 11, following the formation of the first electrode, a passivation layer (hereafter referred to as second passivation layer 23) is formed over at least the driver device, at step 75. The second passivation layer 23 may be formed using a chemical vapor deposition, spin on deposition, oxidation, chemical solution deposition or a combination thereof.

At step 80, a switching thin film transistor 300a, 300b of an amorphous semiconductor material is formed on the second passivation layer 23 overlying the driver device. In the embodiments depicted in FIGS. 2, 5 and 7, forming the switching thin film transistor 300a may begin with forming the gate conductor 28 directly on a portion of the second passivation layer 23. The gate conductor 28 may be formed using a physical vapor deposition process, such as evaporation or sputtering. Photolithography and etch processes may be used in conjunction with the deposition process. Following formation of the gate conductor 28, a gate dielectric 27 is formed on the gate conductor 28. The gate dielectric 27 may be blanket deposited to cover the gate conductor and the exposed portions of the second passivation layer. The gate dielectric 27 may be formed using chemical vapor deposition, such as plasma enhanced chemical vapor deposition.

The channel region 26 of the switching thin film transistor 300a may be composed of hydrogenated amorphous silicon (α-Si:H), which may be deposited using chemical vapor deposition. Lower hydrogen dilution and substrate dependence may be employed to ensure the formation of amorphous material layers, like hydrogenated amorphous silicon (α-Si:H), as opposed to crystalline layers. For example, plasma enhanced chemical vapor deposition can be used to form the channel region 26. In one embodiment, the at least one intrinsic hydrogenated silicon-containing amorphous layer for the channel region 26 is formed in a process chamber including at least one semiconductor precursor source material gas and a carrier, which may contain hydrogen. In one embodiment, the at least one semiconductor precursor source material gas includes a silicon-containing precursor gas. An optional carbon-containing source gas and/or germanium-containing precursor source gas may also be used. Examples of silicon-containing precursor source gases that can be employed in forming the at least one intrinsic hydrogenated silicon-containing layer 20 include, but are not limited to, $SiH_4$, $Si_2H_6$, $SiH_2Cl_2$ and $SiCl_4$. The deposition process for forming the channel region 26 may be a low temperature deposition process. The channel region 26 is typically undoped. Photolithography and etch processes may be used in conjunction with the deposition process to dictate the geometry of the channel region 26.

The source region 24 and the drain region 25 may be formed of a non-crystalline semiconductor, such as amorphous hydrogenated silicon, on opposing ends of the channel region 26 using a deposition process similar to the deposition process that is described above for forming the channel region 26. For example, the source region 24 and the drain region 25 may be formed using a low temperature deposition process. The deposition process may be a chemical vapor deposition process, such as plasma enhance chemical vapor deposition. The dopant that dictates the conductivity type, e.g., n-type or p-type conductivity, of the source region 24 and the drain region 25 may be introduced in-situ or may be introduced to the source region 24 and drain region 25 using ion implantation. Photolithography and etch processes may be used in conjunction with the deposition process to dictate the geometry of the source region 24 and the drain region 25.

Interconnects, such as lines and vias, are then formed providing electrical communication to and from the switching thin film transistor 300a. The interconnects may be formed using deposition, photolithography and etch processes. For example, the interconnects are typically composed of a metal deposited using a physical vapor deposition method, such as evaporation or sputtering. The deposited material layers may be defined, e.g., formed into metal lines, using photolithography and etch processes. Vias extending vertically through the multiple levels of the structure may be formed using an etch process to provide a trench and/or opening followed by a deposition process to fill the via with a conductive material, such as a metal. In the embodiments depicted in FIGS. 2 and 5, the interconnects may include a switching source electrode 29, and a switching drain electrode 30, wherein the switching drain electrode 30 is in direct contact with the gate electrode 17 of the driver device provided by a JFET 100a, 100c. In the embodiment depicted in FIG. 7, the switching drain electrode 30 is in direct contact with the gate electrode 36 of the gate structure 35 to a driver device provided by a MOSFET 100e.

The switching thin film transistor 300b depicted in FIG. 9 is similar to the switching thin film transistor 300a that is depicted in FIGS. 2, 5 and 7. In some embodiments, one difference between the switching thin film transistor 300b depicted in FIG. 9 and the switching thin film transistor 300a that is depicted in FIGS. 2, 5 and 7 is the process sequence used in the formation of these devices. In the embodiment depicted in FIG. 9, forming the switching thin film transistor 300b may begin forming the interconnects, e.g., metal lines and vias, such as the switching source electrode 29' and the switching drain electrode 30', for the switching thin film transistor 300b. The source region 24' and drain region 25' may then be formed of an amorphous semiconductor material using a low temperature deposition process, such as low temperature plasma enhanced chemical vapor deposition. The channel region 26' is then formed of an amorphous semiconductor material using a low temperature deposition process, such as low temperature plasma enhanced chemical vapor deposition. Photolithography and etch process may be used in combination with the deposition process steps for forming the material layers for the channel region 26', source region 24' and drain region 25' so that the source region 24' and the drain region 25' are positioned on opposing ends of the channel region 26'. A gate structure including a gate dielectric 27' and gate conductor 28' may then be formed on the channel region 26'.

A third passivation layer 31 may be formed over the switching thin film transistor 300a, 300b using a chemical vapor deposition, spin on deposition, oxidation, chemical solution deposition or a combination thereof.

Referring to FIG. 11, in a following process step, the organic layers 32 of the OLED may than be formed on the first electrode at step 85. In some embodiments, an opening may be formed through the deposited layers of the third and second passivation layers 31, 23 to expose an upper surface of the first electrode. Thereafter, the organic layers 32 of the OLED may be deposited using thermal evaporation, spin-coating, or other techniques known in the art.

At step 90 of the process flow depicted in FIG. 11, a second electrode of the OLED is formed on the organic layers 32. In some embodiments, the second electrode may be the cathode 33 of the OLED, as depicted in FIGS. 2 and 9, or the second electrode may be the anode 20' of the OLED, as depicted in FIGS. 5 and 7. The second electrode may be formed using physical vapor deposition (PVD) or chemical vapor deposition (CVD). For example, when the second electrode is composed of indium tin oxide (ITO), the ITO may be deposited at room temperature by DC-sputtering from an $In_2O_3/SnO_2$ target in an $Ar/O_2$ atmosphere.

During the process flow described with reference to FIG. 11, the metallization steps used to provide the gate electrode 17, the driver source electrode 21, the driver drain electrode 22, the emitter contact electrode 54, the base contact electrode 55, and the collector contact electrode 56 may also be used to provide a first electrode of the pixel capacitor 400, as well as a providing at least one line, such as the source line 700 (Vdd). The metallization step to provide the switching source electrode 29, 29' and the switching drain electrode 30, 30' may also be used to provide a second electrode of the pixel capacitor 400, as well as providing at least one line, such as the row select line 500 (Vselect) and the column data line 600 (Vdata). The dielectric, e.g., node dielectric, of the pixel capacitor 400 may be provided by the second passivation layer 23.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. An active matrix pixel comprising:
   a switch thin film transistor (TFT) device comprising an amorphous silicon channel layer, wherein the switch TFT device includes a switch TFT gate contact, a switch TFT drain contact and a switch TFT source contact;
   a driver transistor comprising a crystalline channel of single crystal silicon, the single crystal silicon present directly on a first portion of an insulating substrate, the driver transistor including a first contact, a second contact and a third contact all positioned on a first surface of the single crystal silicon that is opposite a second surface of the single crystal silicon that is positioned directly on the insulating substrate, wherein the amorphous silicon channel layer of the switch TFT device overlaps the crystalline channel of the single crystal silicon in a thickness direction of the insulating substrate, a portion of the amorphous silicon channel layer overlapping the crystalline channel in the thickness direction to provide that at least a portion of the crystalline channel of the driver transistor is present within a same cross section as the portion of the amorphous silicon channel layer; and an organic light-emitting diode (OLED) comprising at least one electrode, wherein the switch TFT gate contact is connected to a row select line, one of the switch TFT drain contact and the switch TFT source contact is connected to a data line and the other of said switch TFT drain contact and said switch TFT source contact is connected to the first contact of the driver transistor, and one of the second contact and the third contact of the driver transistor is connected to at least one terminal of a power supply line and the other of said second contact and the third contact of the driver transistor is connected to one of said at least one electrode of the OLED, wherein a single layer bottom electrode of said at least one electrode of the OLED and the crystalline channel of the single crystal silicon are on a same level, the single layer bottom electrode being positioned directly on the insulating substrate.

2. The active matrix pixel of claim 1, wherein the at least one terminal of the power supply line includes a first terminal connected to the driver transistor and a second terminal, the active matrix pixel further comprising a capacitor connected to the first contact of the driver transistor and the second terminal of the power supply line.

3. The active matrix pixel of claim 1, wherein at least one of the first contact, the second contact and the third contact of the driver transistor is comprised of a hydrogenated semiconductor selected from the group consisting of hydrogenated silicon including materials, hydrogenated germanium including materials, hydrogenated silicon germanium including materials and combinations thereof.

4. The active matrix pixel of claim 1, wherein the driver transistor is a metal oxide semiconductor field effect transistor (MOSFET), the first contact being the gate contact, the second contact being the drain contact, and the third contact being the source contact of the MOSFET.

5. The active matrix pixel of claim 1, wherein the driver transistor is a junction field effect transistor (JFET), the first contact being a gate contact of the JFET, the second contact being a drain contact of the JFET, and the third contact being a source contact of the JFET.

6. The active matrix pixel of claim 1, wherein the driver transistor is a bipolar junction transistor (BJT), the first contact being the base contact, the second contact being the collector contact, and the third contact being the emitter contact of the BJT.

7. The active matrix pixel of claim 5, wherein the JFET has a p-type channel conductivity and is connected to an anode of the OLED, wherein direct programming of the active matrix pixel comprises:

$$I_{OLED} \approx I_{DSS}(1-(V_{dd}-V_{data})/|V_p|)^2$$

where $I_{OLED}$ is an OLED current, $I_{DSS}$ is a drain saturation current of the JFET, $V_{dd}$ is a power supply voltage, $V_{data}$ is a data line voltage, and $V_p$ is a pinch-off voltage of the JFET.

8. The active matrix pixel of claim 5, wherein the JFET has an n-type channel conductivity and is connected to an anode of the OLED, wherein the OLED current ($I_{OLED}$) is calculated in accordance with:

$$I_{OLED} \approx I_{DSS}(1-(V_{data}-V_{OLED})/|V_p|)^2$$

where $I_{DSS}$ is a drain saturation current of the JFET, $V_{OLED}$ is a voltage drop across the OLED, $V_{data}$ is a data line voltage, and $V_p$ is a pinch off voltage of the JFET.

9. The active matrix pixel of claim 5, wherein the JFET has an n-type channel conductivity and is connected to a cathode of the OLED, wherein the OLED current is calculated in accordance with:

$$I_{OLED} \approx I_{DSS}(1-V_{data}/|V_p|)^2$$

where $I_{DSS}$ is a drain saturation current of the JFET, $V_{data}$ is a data line voltage, and $V_p$ is a pinch off voltage for the JFET.

10. The active matrix pixel of claim 5, wherein the JFET has a p-type channel conductivity and is connected to a cathode of the OLED, wherein the OLED current is calculated in accordance with:

$$I_{OLED} \approx I_{DSS}(1-(V_{dd}-V_{data}-V_{OLED})/|V_p|)^2$$

where $I_{DSS}$ is a drain saturation current of the JFET, $V_{OLED}$ is the OLED voltage, $V_{data}$ is a data line voltage, $V_{dd}$ is a power supply voltage, and $V_p$ is a pinch off voltage of the JFET.

11. The active matrix pixel of claim 4, wherein the MOSFET has a p-type channel conductivity and is connected to an anode of the OLED, wherein direct programming of the active matrix pixel comprises:

$$I_{OLED} \approx K(V_{dd}-V_{data}-|V_T|)^2$$

where $I_{OLED}$ is the OLED current, K is a constant, $V_{dd}$ is the power supply voltage, $V_{data}$ is a data line voltage, and $V_T$ is a threshold voltage of the MOSFET.

12. The active matrix pixel of claim 4, wherein the MOSFET has an n-type channel conductivity and is connected to an anode of the OLED, wherein the OLED current ($I_{OLED}$) is calculated in accordance with:

$$I_{OLED} \approx K(V_{data}-V_{OLED}-|V_T|)^2$$

where K is a constant, $V_{OLED}$ is a voltage of the OLED, $V_{data}$ is a data line voltage, and $V_T$ is a threshold voltage of the MOSFET.

13. The active matrix pixel of claim 4, wherein the MOSFET has an n-type channel conductivity and is connected to a cathode of the OLED, wherein current to the OLED is calculated in accordance with:

$$I_{OLED} \approx K(V_{data}-|V_T|)^2$$

where K is a constant, $V_{data}$ is a data line voltage, and $V_T$ is a threshold voltage for the MOSFET.

14. The active matrix pixel of claim 4, wherein the MOSFET has a p-type conductivity and is connected to a cathode of the OLED, wherein current to the OLED is calculated in accordance with:

$$I_{OLED} \approx K(V_{dd}-V_{data}-V_{OLED}-|V_T|)^2$$

where K is a constant, $V_{OLED}$ is a voltage of the OLED, $V_{data}$ is a data line voltage, $V_{dd}$ is a power supply voltage, and $V_T$ is a threshold voltage of the MOSFET.

15. The active matrix pixel of claim 6, wherein the BJT is a PNP transistor, and the BJT is connected to an anode of the OLED pixel, wherein the current flowing through the OLED pixel ($I_{OLED}$) is equal to:

$$I_{OLED} \approx (V_{dd}-V_{EB}-V_{data})/(R_E+R_B/\beta)$$

where $I_{OLED}$ is an OLED current, $V_{dd}$ is a power supply voltage, $V_{EB}$ is an emitter-base voltage of the BJT, $V_{data}$ is a data line voltage, $R_E$ is an emitter resistance, $R_B$ is a base resistance and $\beta$ is a current gain of the BJT.

16. The active matrix pixel of claim 6, wherein the BJT is an NPN transistor, and the BJT is connected to a cathode of the OLED pixel, wherein the current flowing through the OLED pixel ($I_{OLED}$) is equal to:

$$I_{OLED} \approx K(V_{data}-V_{BE})/(R_E+R_B/\beta)$$

where $I_{OLED}$ is an OLED current, $V_{BE}$ is a base-emitter voltage of the BJT, $V_{data}$ is a data line voltage, K is a constant, $R_E$ is an emitter resistance, $R_B$ is a base resistance and β is a current gain of the BJT.

17. A method of forming an active matrix pixel comprising:
    forming a driver transistor on a first portion of an insulating substrate, the driver transistor including hydrogenated semiconductor including contact regions on a crystalline channel of single crystal silicon, the single crystal silicon present directly on the first portion of the insulating substrate, wherein the hydrogenated semiconductor including contact regions are formed using a low temperature deposition process;
    forming an electrode of an organic light emitting diode (OLED) directly on a second portion of the insulating substrate, wherein the electrode is in electrical communication to receive an output from the driver transistor, wherein the electrode of the OLED and the crystalline channel of the single crystal silicon are on a same level;
    forming at least one passivation layer over the driver transistor; and
    forming a switch thin film transistor (TFT) device comprising an amorphous silicon channel layer on the at least one passivation layer over the driver transistor,
    wherein the amorphous silicon channel layer of the switch TFT device overlaps the crystalline channel of the single crystal silicon in a thickness direction of the insulating substrate.

18. The method of claim 17, wherein the low temperature deposition process comprises a temperature ranging from 150° C. to 350° C.

19. The method of claim 17, wherein the driver transistor comprises a junction field effect transistor, a metal oxide semiconductor field effect transistor, a bipolar junction transistor, or a combination thereof, and wherein the hydrogenated semiconductor including contact regions have an amorphous crystal structure.

20. The method of claim 17, wherein the switch TFT device is positioned over the driver transistor.

* * * * *